United States Patent
Lu et al.

(10) Patent No.: US 7,125,450 B2
(45) Date of Patent: Oct. 24, 2006

(54) PROCESS FOR PREPARING SINGLE CRYSTAL SILICON USING CRUCIBLE ROTATION TO CONTROL TEMPERATURE GRADIENT

(75) Inventors: Zheng Lu, St. Charles, MO (US); Steven L. Kimbel, St. Charles, MO (US); Ying Tao, St. Peters, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 219 days.

(21) Appl. No.: 10/699,038

(22) Filed: Oct. 31, 2003

(65) Prior Publication Data
US 2004/0118333 A1 Jun. 24, 2004

Related U.S. Application Data

(60) Provisional application No. 60/425,546, filed on Nov. 12, 2002.

(51) Int. Cl.
*C30B 15/20* (2006.01)
(52) U.S. Cl. .............................. 117/15; 117/13; 117/14; 117/20; 117/25; 117/31; 117/218; 117/219
(58) Field of Classification Search .................. 117/13, 117/14, 15, 20, 25, 31, 218, 215
See application file for complete search history.

(56) References Cited

U.S. PATENT DOCUMENTS

| | | | |
|---|---|---|---|
| 4,040,895 A | 8/1977 | Patrick et al. | |
| 4,239,585 A | 12/1980 | Köhl | |
| 4,436,577 A | 3/1984 | Frederick et al. | |
| 4,659,423 A | 4/1987 | Kim et al. | |
| 5,162,072 A | 11/1992 | Azad | |
| 5,178,720 A | 1/1993 | Frederick | |
| 5,196,085 A | 3/1993 | Szekely et al. | |
| 5,215,620 A | 6/1993 | Kodama et al. | |
| 5,360,599 A | 11/1994 | Cueman et al. | |
| 5,436,175 A | 7/1995 | Nakato et al. | |
| 5,494,849 A | 2/1996 | Iyer et al. | |
| 5,593,498 A | 1/1997 | Kimbel et al. | |
| 5,683,504 A | 11/1997 | Izunome et al. | |
| 5,766,341 A | 6/1998 | Kimbel et al. | |
| 5,817,176 A * | 10/1998 | Sung et al. .................. 117/201 |
| 5,820,672 A * | 10/1998 | Bell et al. ...................... 117/20 |
| 5,868,831 A | 2/1999 | Dornberger et al. | |
| 5,902,394 A | 5/1999 | Burkhart et al. | |
| 5,919,302 A | 7/1999 | Falster et al. | |
| 5,938,841 A | 8/1999 | Kitagawa et al. | |

(Continued)

FOREIGN PATENT DOCUMENTS

EP 0429847 A 6/1991

(Continued)

OTHER PUBLICATIONS

International Search Report for analogous application No. PCT/US 03/34883, dated Apr. 23, 2004.

*Primary Examiner*—Robert Kunemund
(74) *Attorney, Agent, or Firm*—Senniger Powers

(57) ABSTRACT

The present invention is directed to a process for preparing single crystal silicon, in ingot or wafer form, wherein crucible rotation is utilized to control the average axial temperature gradient in the crystal, $G_0$, as a function of radius (i.e., $G_0(r)$), particularly at or near the central axis. Additionally, crucible rotation modulation is utilized to obtain an axially uniform oxygen content therein.

75 Claims, 12 Drawing Sheets

U.S. PATENT DOCUMENTS

| | | |
|---|---|---|
| 5,954,873 A | 9/1999 | Hourai et al. |
| 5,968,264 A | 10/1999 | Iida et al. |
| 5,994,761 A | 11/1999 | Falster et al. |
| 6,045,610 A | 4/2000 | Park et al. |
| 6,180,220 B1 | 1/2001 | Falster et al. |
| 6,190,631 B1 | 2/2001 | Falster et al. |
| 6,214,109 B1 * | 4/2001 | Holder ........................ 117/208 |
| 6,254,672 B1 | 7/2001 | Falster et al. |
| 6,287,380 B1 | 9/2001 | Falster et al. |
| 6,312,516 B1 | 11/2001 | Falster et al. |
| 6,328,795 B1 | 12/2001 | Falster et al. |
| 6,391,662 B1 | 5/2002 | Mule'Stagno et al. |
| 6,458,204 B1 | 10/2002 | Okui et al. |
| 2003/0033972 A1 * | 2/2003 | Javidi .......................... 117/13 |
| 2003/0150373 A1 * | 8/2003 | Kubo et al. .................... 117/13 |

FOREIGN PATENT DOCUMENTS

| | | |
|---|---|---|
| EP | 1158076 A1 | 11/1999 |

* cited by examiner

PROCESS FOR PREPARING SINGLE CRYSTAL SILICON USING CRUCIBLE ROTATION TO CONTROL TEMPERATURE GRADIENT

REFERENCE TO RELATED APPLICATION

This application claims priority from U.S. Provisional Application Ser. No. 60/425,546, filed Nov. 12, 2002. The entire contents of this provisional application is incorporated herein by reference.

BACKGROUND OF THE INVENTION

The present invention generally relates to the preparation of semiconductor grade single crystal silicon which is used in the manufacture of electronic components. More particularly, the present invention relates to a process for preparing single crystal silicon, in ingot or wafer form, wherein crucible rotation is utilized to control the average axial temperature gradient in the crystal, $G_0$, as a function of radius (i.e., $G_0(r)$), particularly at or near the central axis. Additionally, crucible rotation modulation is utilized to obtain an axially uniform oxygen content. In one particular embodiment, the present invention is directed to a process for preparing single crystal silicon having an axially symmetric region which is substantially devoid of agglomerated intrinsic point defects using crucible rotation to improve radial uniformity of $G_0$.

Single crystal silicon, which is the starting material in most processes for the fabrication of semiconductor electronic components, is commonly prepared by the so-called Czochralski ("Cz") method. In this method, polycrystalline silicon ("polysilicon") is charged to a crucible and melted, a seed crystal is brought into contact with the molten silicon and a single crystal is grown by slow extraction. After formation of a neck is complete, the diameter of the crystal is enlarged by, for example, decreasing the pulling rate and/or the melt temperature until the desired or target diameter is reached. The cylindrical main body of the crystal which has an approximately constant diameter is then grown by controlling the pull rate and the melt temperature while compensating for the decreasing melt level. Near the end of the growth process but before the crucible is emptied of molten silicon, the crystal diameter must be reduced gradually to form an end-cone. Typically, the end-cone is formed by increasing the crystal pull rate and heat supplied to the crucible. When the diameter becomes small enough, the crystal is then separated from the melt.

It is now recognized that a number of defects in single crystal silicon form in the growth chamber as the ingot cools from the temperature of solidification. More specifically, as the ingot cools intrinsic point defects, such as crystal lattice vacancies or silicon self-interstitials, remain soluble in the silicon lattice until some threshold temperature is reached, below which the given concentration of intrinsic point defects becomes critically supersaturated. Upon cooling to below this threshold temperature, a reaction or agglomeration event occurs, resulting in the formation of agglomerated intrinsic point defects.

As has been reported elsewhere (see, e.g., U.S. Pat. Nos. 5,919,302; 6,254,672; 6,287,380; 6,328,795; and, 6,312,516, all of which are incorporated herein by reference), the type and initial concentration of these point defects in the silicon are determined as the ingot cools from the temperature of solidification (i.e., about 1410° C.) to a temperature greater than about 1300° C. (i.e., about 1325° C., 1350° C. or more); that is, the type and initial concentration of these defects are controlled by the ratio $v/G_0$, where v is the growth velocity and $G_0$ is the average axial temperature gradient in the crystal over this temperature range. Specifically, referring now to FIG. 1, for increasing values of $v/G_0$, a transition from decreasingly self-interstitial dominated growth to increasingly vacancy dominated growth occurs near a critical value of $v/G_0$ which, based upon currently available information, appears to be about $2.1 \times 10^{-5}$ cm$^2$/sK, where $G_0$ is determined under conditions in which the axial temperature gradient is constant within the temperature range defined above. Accordingly, process conditions, such as growth rate (which affect v), as well as hot zone configurations (which affect $G_0$), can be controlled to determine whether the intrinsic point defects within the single crystal silicon will be predominantly vacancies (where $v/G_0$ is generally greater than the critical value) or self-interstitials (where $v/G_0$ is generally less than the critical value).

Agglomerated defect formation generally occurs in two steps; first, defect "nucleation" occurs, which is the result of the intrinsic point defects being supersaturated at a given temperature. Once this "nucleation threshold" temperature is reached, intrinsic point defects agglomerate. The intrinsic point defects will continue to diffuse through the silicon lattice as long as the temperature of the portion of the ingot in which they are present remains above a second threshold temperature (i.e., a "diffusivity threshold"), below which intrinsic point defects are no longer mobile within commercially practical periods of time. While the ingot remains above this temperature, vacancy or interstitial intrinsic point defects diffuse through the crystal lattice to sites where agglomerated vacancy defects or interstitial defects, respectively, are already present, causing a given agglomerated defect to grow in size. Growth occurs because these agglomerated defect sites essentially act as "sinks," attracting and collecting intrinsic point defects because of the more favorable energy state of the agglomeration.

Accordingly, the formation and size of agglomerated defects are dependent upon the growth conditions, including $v/G_0$ (which impacts the initial concentration of such point defects), as well as the cooling rate or residence time of the main body of the ingot over the range of temperatures bound by the "nucleation threshold" at the upper end and the "diffusivity threshold" (which impacts the size and density of such defects) at the lower end. As has been previously reported (see, e.g., the U.S. patents referenced above), control of the cooling rate or residence time enables the formation of agglomerated intrinsic point defects to be suppressed over much larger ranges of values for $v/G_0$; that is, controlled cooling allows for a much larger "window" of acceptable $v/G_0$ values to be employed while still enabling the growth of substantially defect-free silicon.

However, with respect to the type and initial concentration of intrinsic point defects, it is recognized that at the time of solidification the pull rate, and thus essentially v, is substantially constant as a function of radius at that particular axial position; that is, v is essentially constant radially at each axial position in the ingot. It is further recognized that typically the concentration, and possibly the type, of intrinsic point defects is not constant along the radius due to the heat-loss at the outer or lateral surface of the ingot, which therefore causes $G_0$ to increase along the radius moving from the center of the ingot outward. In general, this is due to the limitations on hot zone design (i.e., the inability to sufficiently limit heat loss at the crystal surface). This inability to control $G_0(r)$ becomes more pronounced as the actual value of $G_0$ increases. As a result, increasing the throughput of substantially defect-free silicon becomes more difficult (an increase in v typically requiring an increase in $G_0$ in order to maintain the desired type and initial concentration of point defects).

SUMMARY OF THE INVENTION

Briefly, therefore, the present invention is directed to a process for pulling a single crystal silicon ingot in accordance with the Czochralski method, wherein a seed crystal is brought into contact with a silicon melt contained within a crucible, which is coaxial with the seed, and then is withdrawn therefrom to form a neck adjacent the seed crystal, a seed-cone adjacent the neck, and a constant diameter portion adjacent the seed-cone, said constant diameter portion having a nominal diameter of at least 150 mm, the constant diameter portion having (i) a length, L, as measured along the axis of the ingot from a transition from the seed-cone to the constant diameter portion, (ii) a first series of positions, $P_{(1 \to n)}$, located a distance, $D_{(1 \to n)}$, respectively, from the transition along the axis determined as a fraction of L, and (iii) a second series of positions, $PP^{(1 \to n)}$, located a distance, $DD^{(1 \to n)}$, respectively, from the transition along the axis determined as a fraction of L, wherein positions and their respective distances in the second series may be the same or different from those in the first. The process comprises (a) rotating the seed crystal and the crucible in opposite directions; (b) decreasing the mean crucible rotation rate (CR) as a function of increasing axial length of the constant diameter portion of the ingot wherein the mean crucible rotation rate at a position, $P_1$, is greater than the mean crucible rotation rate at a position, $P_2$, wherein $D_2 \geq (D_1 + 0.1 \text{ L})$; and, (c) controlling an average axial oxygen content in the constant diameter portion to be substantially constant by crucible rotation rate modulation (CRM).

The present invention is further directed to a process for pulling a single crystal silicon ingot in accordance with the Czochralski method, wherein a seed crystal is brought into contact with a silicon melt contained within a crucible, which is coaxial with the seed, and then is withdrawn therefrom to form a neck adjacent the seed crystal, a seed-cone adjacent the neck, and a constant diameter portion adjacent the seed-cone, said constant diameter portion having a nominal radius extending from the axis to a lateral surface thereof of at least 75 mm. The process comprises: (a) rotating the seed crystal and the crucible in opposite directions; (b) rotating a crucible at a mean crucible rotation rate (CR) during growth of the constant diameter portion which is sufficient to obtain a melt-solid interface having a height near the axis, $Z_a$, of at least about 5 mm, as measured from the melt surface, and a height $Z_{R/2}$, where $Z_{R/2}$ is the height of the interface above the melt surface at about a midpoint of the radius, which is at least about 120% of $Z_a$; and, (c) controlling an average axial oxygen content in the constant diameter portion to be substantially constant by crucible rotation modulation (CRM).

The present invention is still further directed to a process for pulling a single crystal silicon ingot in accordance with the Czochralski method, wherein a seed crystal is brought into contact with a silicon melt contained within a crucible, which is coaxial with the seed, and then is withdrawn therefrom to form a neck adjacent the seed crystal, a seed-cone adjacent the neck, and a constant diameter portion adjacent the seed-cone, said constant diameter portion having a nominal diameter of at least 150 mm. The process comprises: (a) rotating the seed crystal and the crucible in opposite directions; (b) controlling a ratio $v/G_0$, wherein v is a growth velocity and $G_0$ is an average axial temperature gradient over a temperature range from solidification to no less than about 1300° C. for at least a segment of said constant diameter portion of the ingot, control of said ratio comprising decreasing a mean crucible rotation rate (CR) as said segment is grown; (c) controlling an average axial oxygen content in the segment to be substantially constant by crucible rotation modulation (CRM); and, (d) controlling a cooling rate of said segment from the solidification temperature to about 1,050° C. or less, wherein said segment comprises an axially symmetric region which is substantially free of (i) agglomerated vacancy defects, or (ii) A-type agglomerated interstitial defects.

In one particular embodiment of the previous process, $v/G_0$ is so controlled to cause the formation of an axially symmetrical region within the segment which is substantially free of agglomerated intrinsic point defects, the predominant intrinsic point defect therein being either silicon self-interstitials or silicon lattice vacancies.

It is to be further noted that in any of the previous embodiments of the present process crucible rotation modulation (CRM) may be optionally utilized to achieve an oxygen concentration which is substantially constant, said oxygen concentration falling essentially anywhere within the range generally achievable by a Czochralski-type growth process.

Other features of this invention will be in part apparent and in part pointed out hereinafter.

DETAILED DESCRIPTION OF THE PREFERRED EMBODIMENTS

Figure 1:
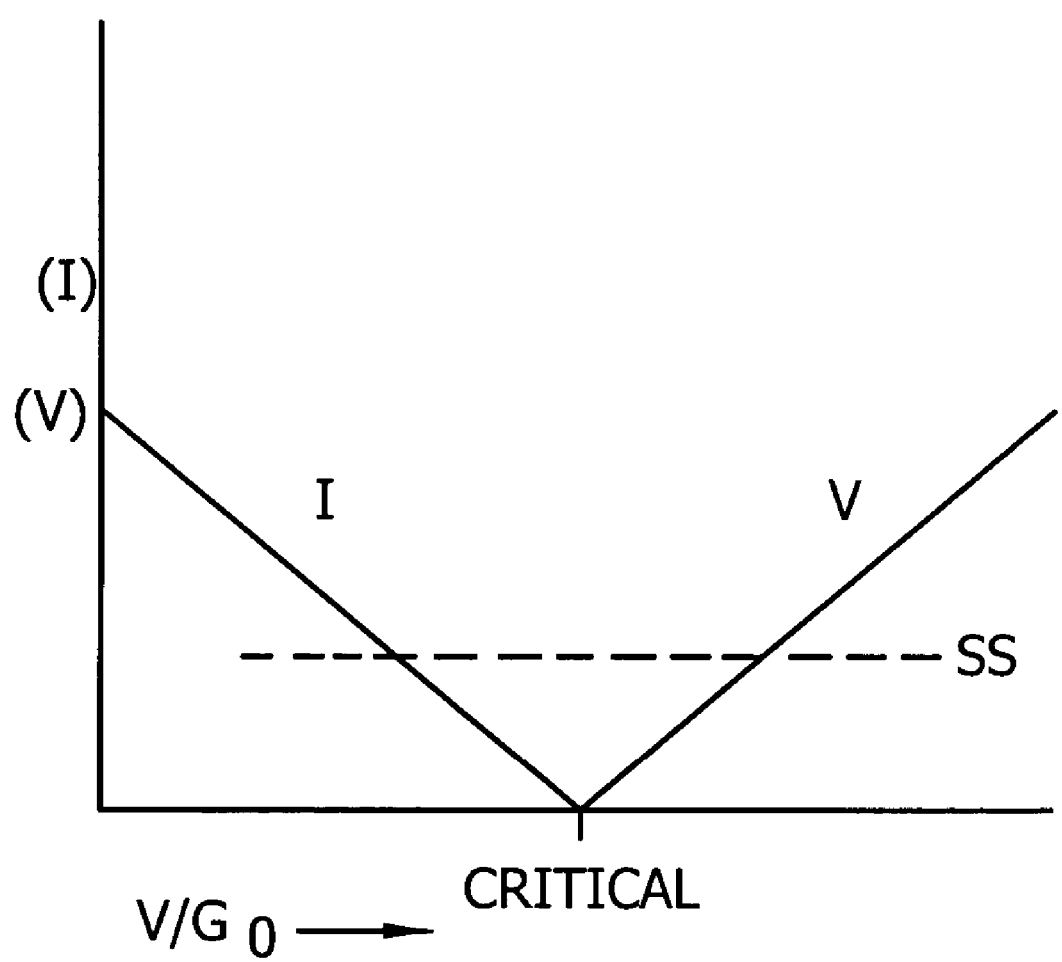
FIG. 1 is a graph which illustrates an example of how the initial concentration of self-interstitials, [I], and vacancies, [V], changes with an increase in the value of the ratio $v/G_0$, where v is the growth rate and $G_0$ is the average axial temperature gradient in the crystal (the dashed line herein, denoted "SS," indicating a concentration threshold of critical supersaturation).
Figure 2:
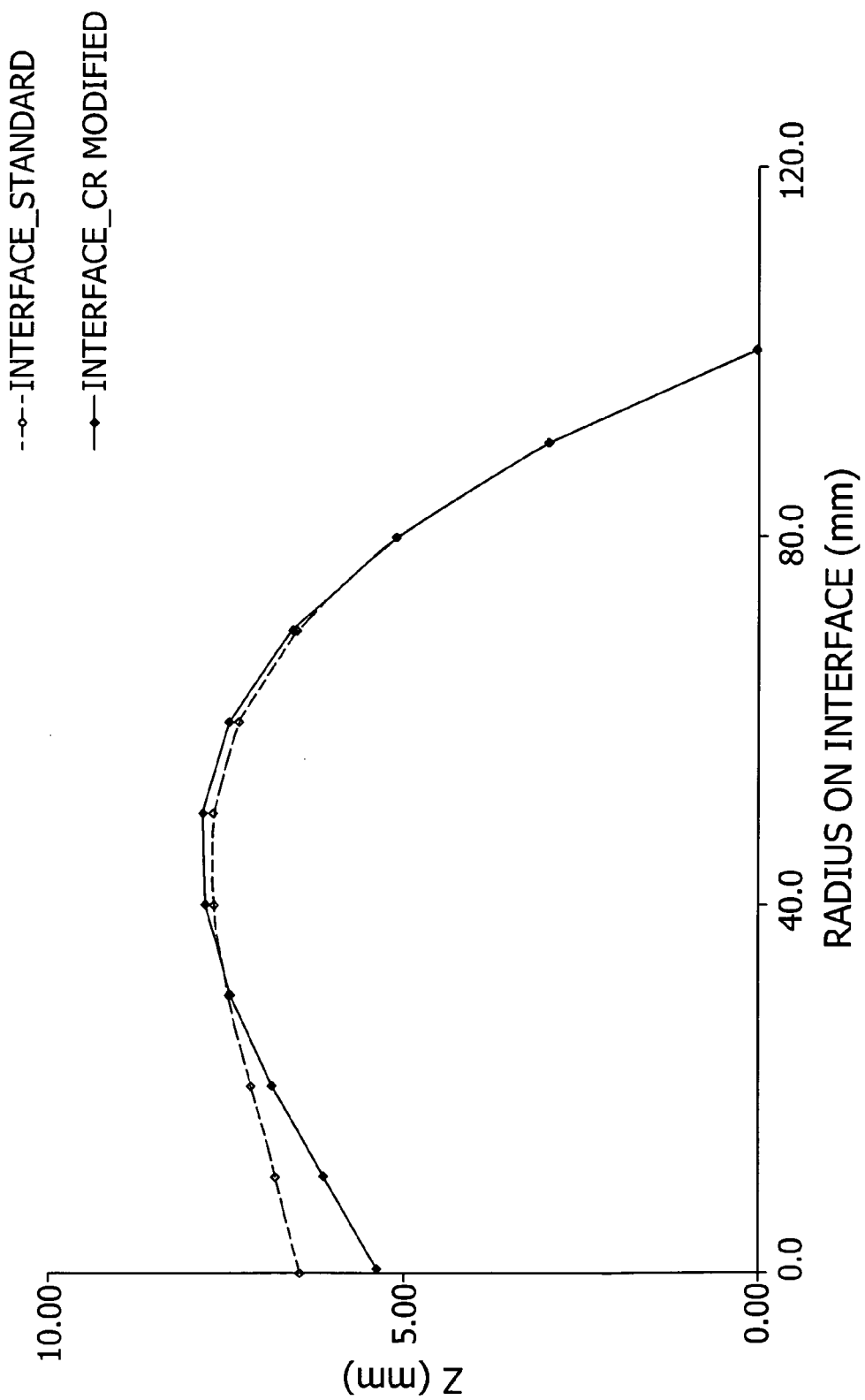
FIG. 2 is a graph which illustrates the melt-solid interface shape as a function of radius for an ingot prepared in accordance with the present process and one prepared in accordance with a known process, wherein CR is increased as a function of main body length.
Figure 3:
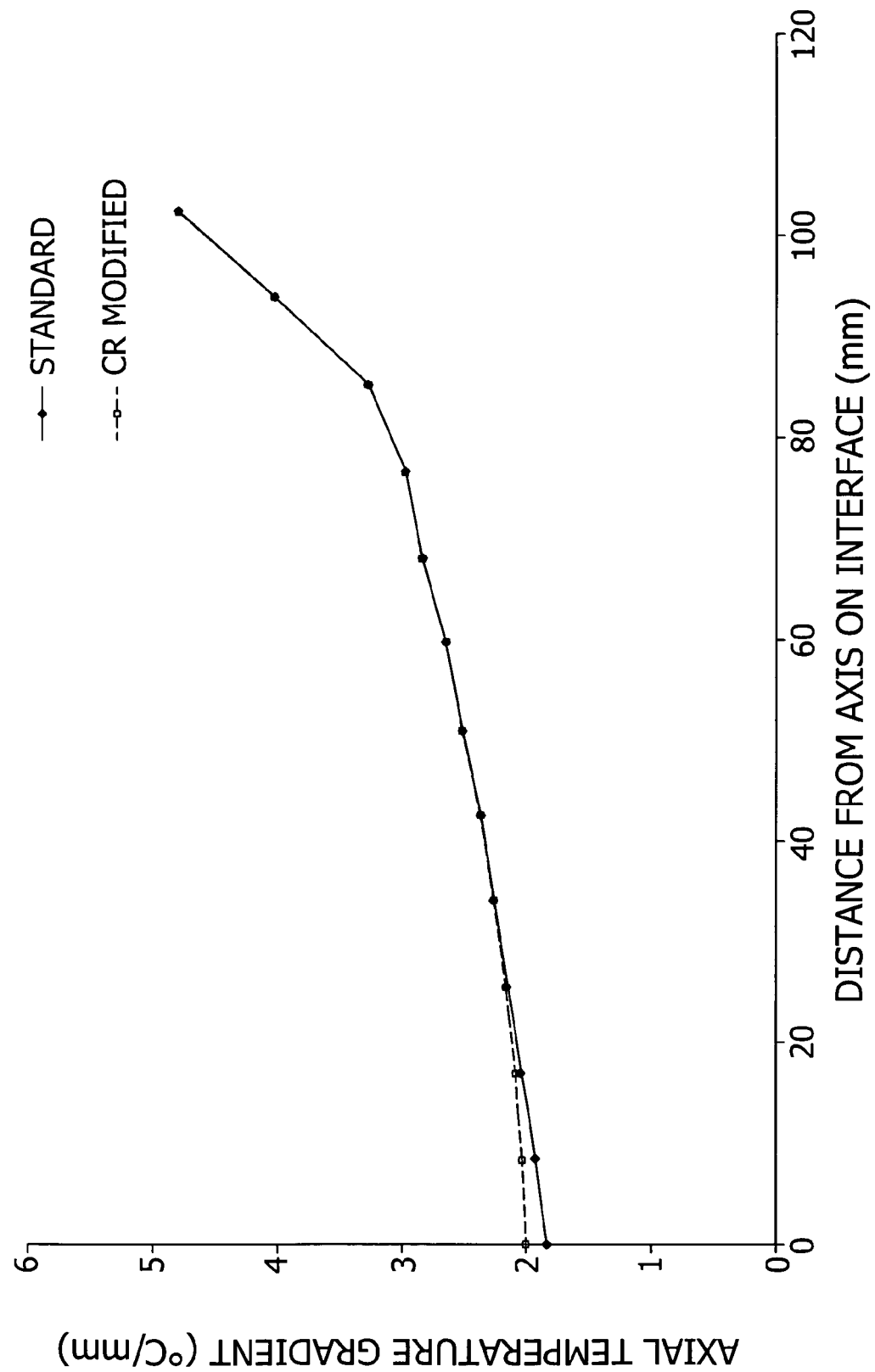
FIG. 3 is a graph which illustrates the axial temperature gradient, $G_0$, as a function of radius for an ingot prepared in accordance with the present process and one prepared in accordance with a known process, wherein CR is increased as a function of main body length.

Generally speaking, in accordance with the present invention, it has been discovered that the mean crucible rotation rate (CR) may be controlled to alter the shape of the melt-solid interface and the average axial temperature gradient in the crystal, $G_0$, defined over the temperature range from solidification to a temperature of greater than about 1300° C. (e.g., 1325° C., 1350° C. or more), as illustrated by FIGS. 2 and 3, respectively. In particular, the process of the present invention utilizes CR to increase the average axial temperature gradient near a central axis of the growing crystal while having substantially no effect on the gradient near a lateral surface thereof, even at values of $G_0$ which are substantially higher than conventional processes, and, as a result, effectively renders $v/G_0$ more uniform as a function of radius.

Figure 4A:
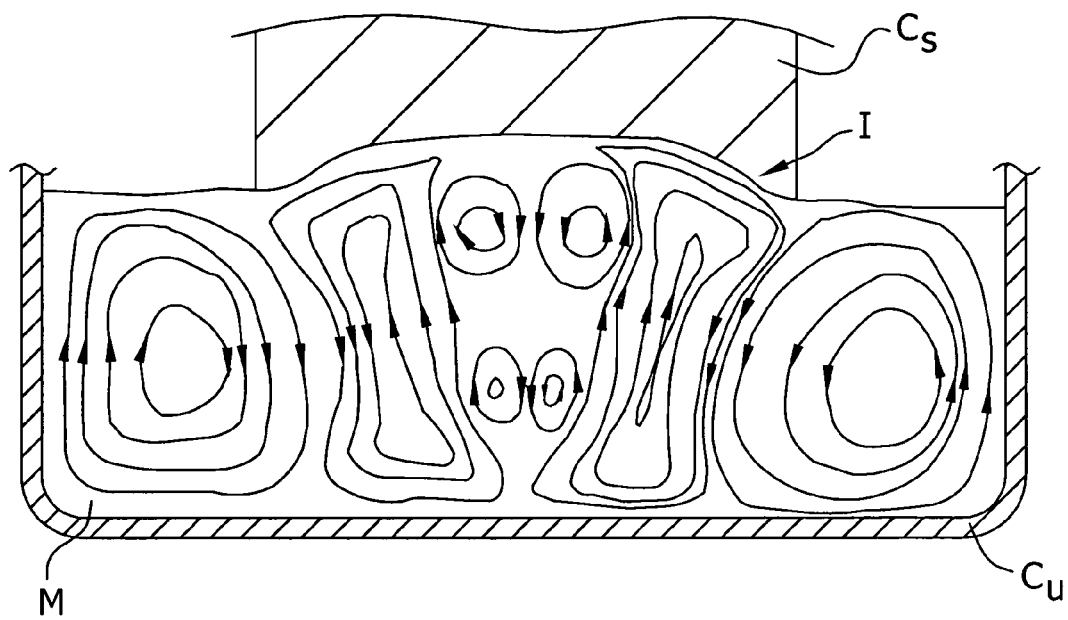
FIGS. 4A and 4B are cross-sectional, schematic views of crystal growth processes discussed herein, showing in detail a crystal segment (Cs), the silicon melt (M), the melt-solid interface (I), and the crucible (Cu) in which the melt is contained, which are provided for the purpose of generally illustrating the theory of the present invention (4A illustrating a standard process wherein there is less downward flow at the center of the melt, and 4B illustrating a process using CR manipulation wherein there is more downward flow at the center of the melt).
Figure 4B:
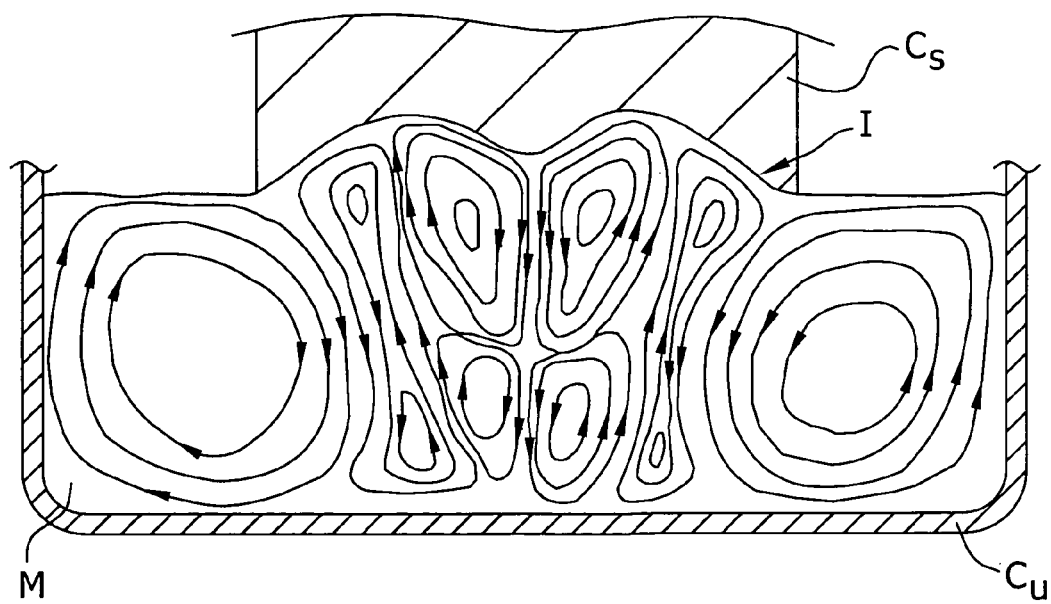

Without being held to any particular theory, and with reference to FIGS. 4A and 4B (which are provided for purposes of illustration only), it is generally believed that crucible rotation acts to alter the melt flow during growth of a single crystal silicon ingot to render the melt less turbulent near the central axis of the ingot, resulting in a more downward flow, or less upward flow, thereof. This has the effect of distributing more heat from the melt through the crystal near the central axis, and thus increase the gradient in the growing ingot near the central axis.

It is well-recognized that increasing $G_0$ is desirable because this in turn allows v, primarily controlled by the pull rate, to be increased while still obtaining the same $v/G_0$ ratio, thus increasing throughput of the same type and quality of single crystal silicon. The present approach for controlling or altering $G_0$, particularly at or near the central axis, is distinguishable from other approaches to increase $G_0$ which utilize hot zone design. In particular, such conventional approaches generally result in an increase is $G_0$ over substantially the entire radius of the ingot, particularly at the radial edge, while the present process achieves a higher $G_0$ near the central axis and little if any change in $G_0$. at the radial edge. Further, the present approach is distinguishable from conventional Czochralski-type processes, wherein mean crucible rotation rate is constant or increased as a function of length of the constant diameter portion of the crystal in order to obtain an axially uniform oxygen concentration therein (see, e.g., U.S. Pat. Nos. 5,593,498; 5,766,341; 5,215,620; 4,040,895; 4,436,577 and 5,178,720, all of which are incorporated herein by reference), in that it utilizes a decreasing CR over a portion of, and in some embodiments essentially all of, the axial length of the constant diameter portion of the crystal.

The present process compensates for reduction in oxygen concentration control or uniformity in the constant diameter portion by means of crucible rotation modulation (CRM). Generally speaking, it has been observed that, in at least some embodiments, increasing the amplitude and/or period of the CRM enables oxygen concentrations which are comparable to existing Cz processes; in fact, the present process allows for essentially any oxygen concentration which is common to Cz-types growth techniques to be obtained (i.e., a concentration falling within the range of about 10 PPMA to about 18 PPMA, per ASTM F-121-83, including for example a concentration of about 10, about 12, about 14, about 16 or even about 18 PPMA).

Figure 5:
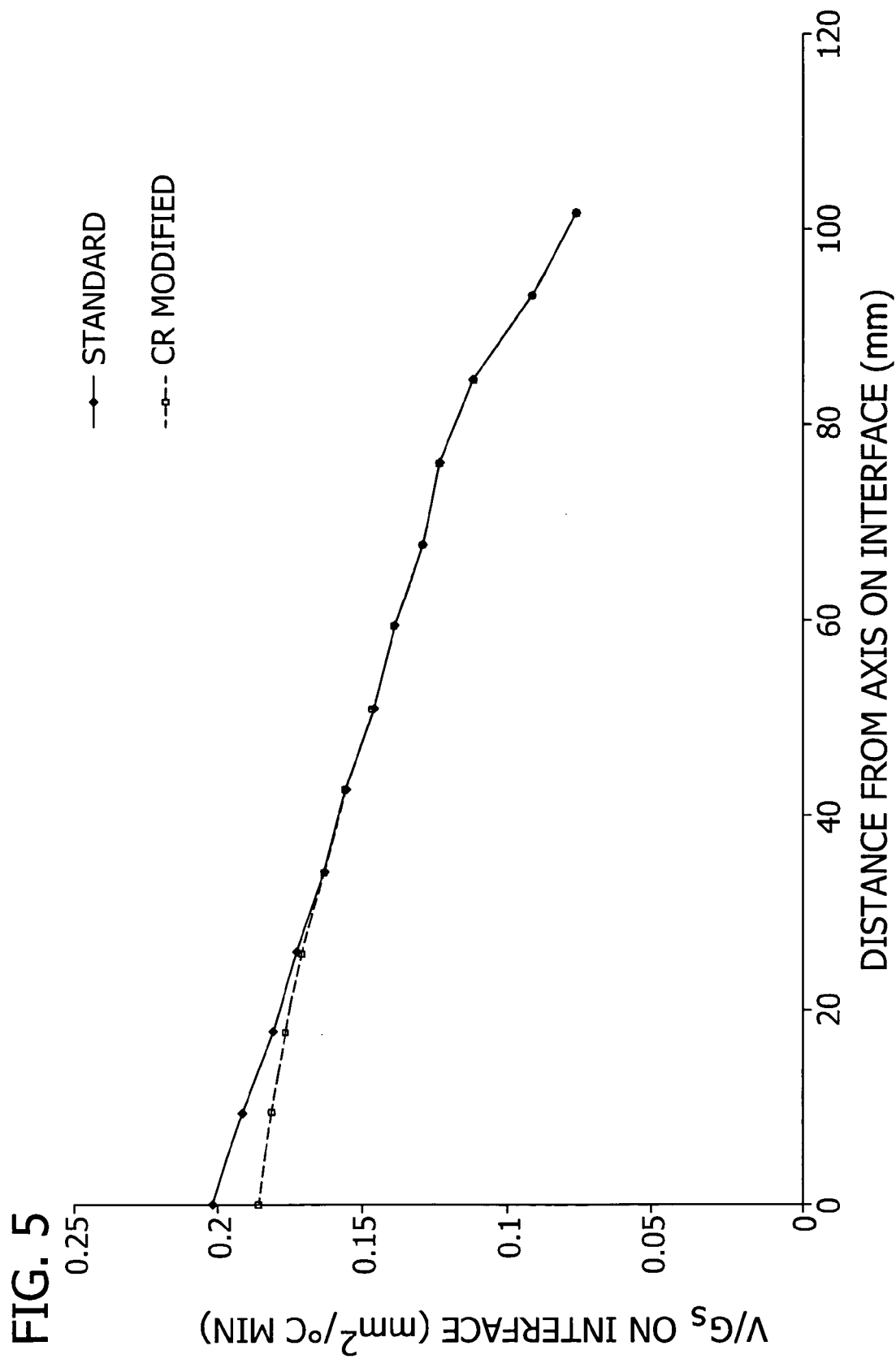
FIG. 5 is a graph which illustrates how the ratio $v/G_0$ changes as a function of radius, provided to illustrate how the present process acts to decrease variability therein, as compared to a known process wherein CR is increased as a function of main body length.

In one particularly preferred embodiment of the present invention, control of mean crucible rotation rate may be utilized with pull rate and other parameters known in the art to control the ratio $v/G_0$, optionally in conjunction with the cooling rate (as further described herein), in order to limit, and more preferably prevent, the formation of agglomerated intrinsic point defects in a segment or all of the constant diameter portion of the single crystal silicon ingot. As further described and illustrated herein (see, e.g., FIG. 5), growing substantially defect-free single crystal silicon in this way is advantageous in that it acts to make $v/G_0(r)$ more uniform. Such conditions are believed beneficial to maximizing yield, at least in part because they act to ensure that each segment of the constant diameter portion of the ingot is uniformly grown (i.e., exposed to substantially the same thermal conditions and cooling rates). In addition, because the ratio $v/G_0$ is controlled by $G_0$, and more specifically by one or more parameters affecting $G_0$, rather than by v, the growth velocity may be set at the highest rate possible to maximize throughput.

I. Interface Shape

Figure 6B:
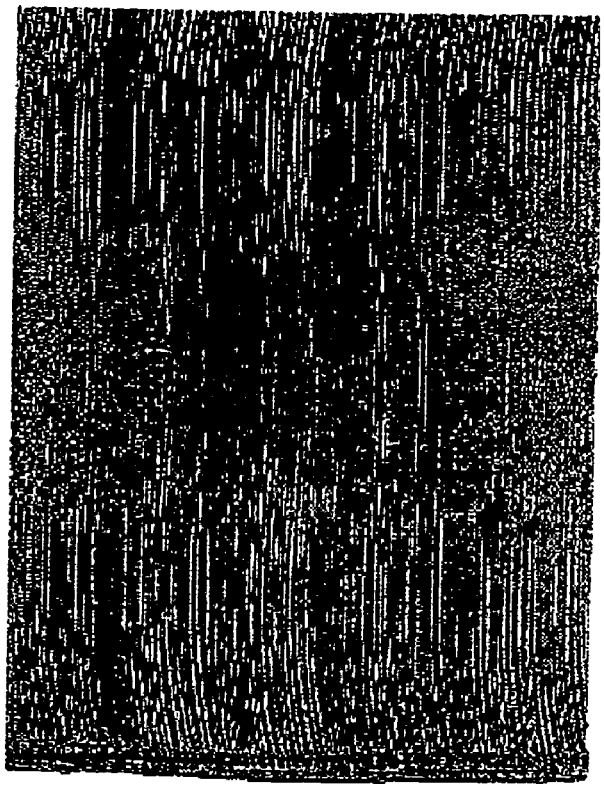
FIGS. 6A and 6B are photocopies of images of axial cuts of segments of two ingots, prepared as generally described in the Example herein, following a thermal anneal to enhance oxygen precipitation, copper decoration thereof, and lifetime mapping to reveal the interface shapes therein, as further described in the Example.
Figure 6A:
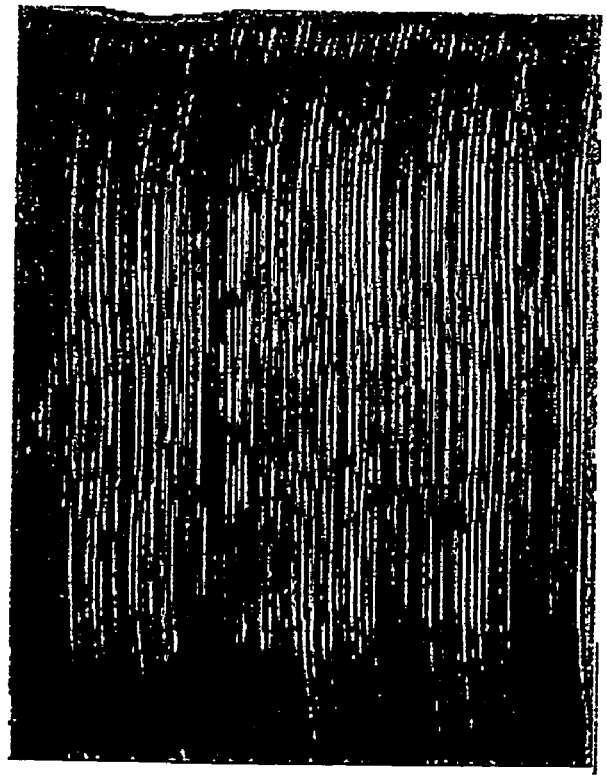
Figure 7:
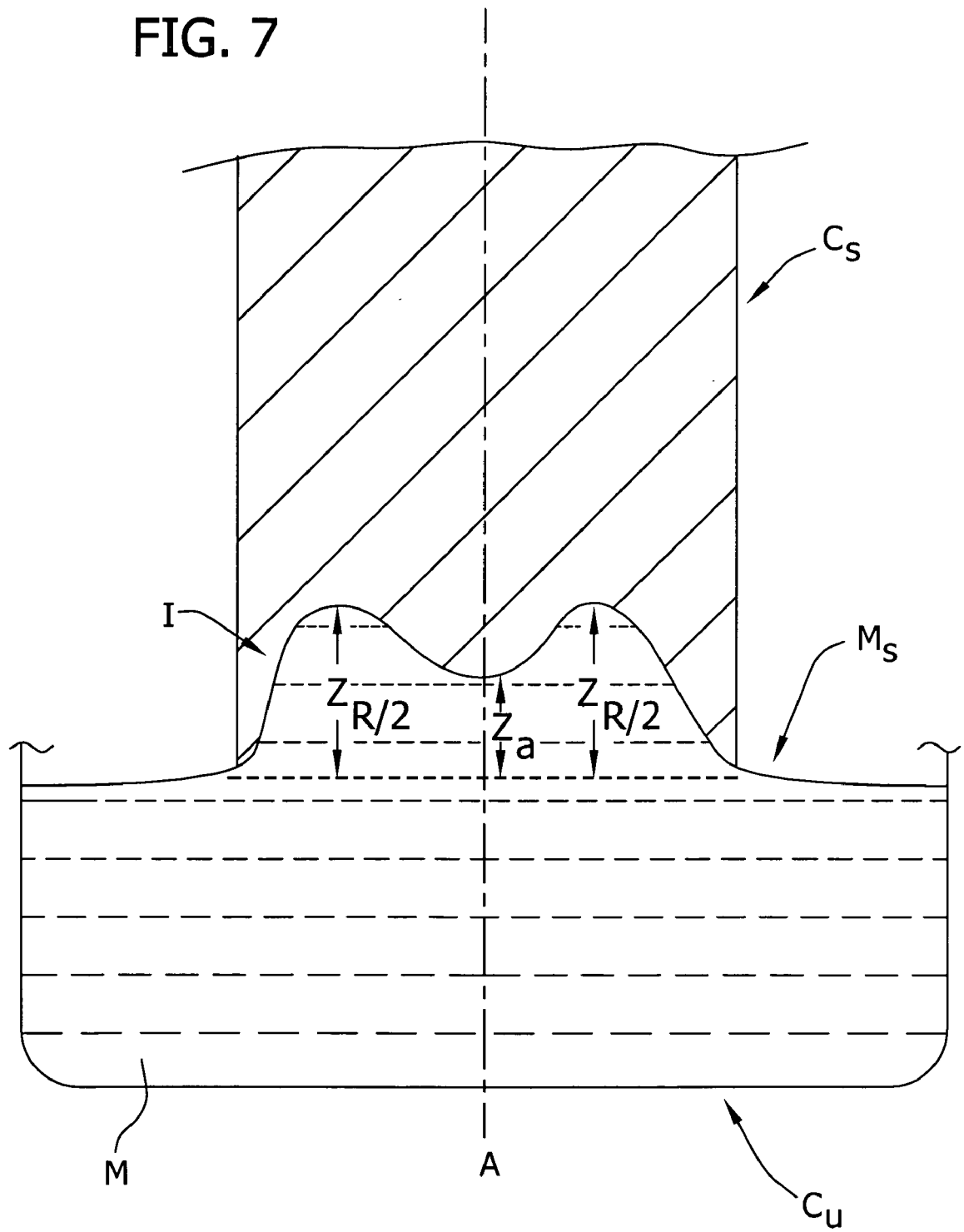
FIG. 7 is a schematic, cross-sectional view of a crystal growth process, showing in detail a constant diameter crystal segment (Cs), the silicon melt (M), the melt-solid interface (I), the melt surface (Ms), the crucible (Cu) in which the melt is contained, and a central axis (A) therethough, which is provided for the purpose of further illustrating the melt-solid interface shape obtained during the growth process of the present invention.

Referring now to FIGS. 4A and 4B, as well as FIGS. 6A and 6B, it is to be noted that, in accordance with the present process, control of the mean crucible rotation rate, during growth of the constant diameter portion or main body of the single crystal silicon ingot, results in an "M-shaped" or "gull-wing shaped" melt-solid interface. Referring specifically to FIG. 7, the interface has in some embodiments a height at or near the central axis, $Z_a$, which is at least about 5 mm, 10 mm, 15 mm or more above the melt level (i.e., the distance between the melt level in the crucible and the melt-solid interface at or near the central axis, as measured along the central axis). Further, moving radially outward from the central axis, the interface has a height at about a midpoint in or half of the radius, $Z_{R/2}$, which is at least about 120% of the height $Z_a$, and in some embodiments may be about 125%, 130%, 135%, 140%, 145%, 150% or more.

Such an interface may result from control of the mean rotation rate after about 10%, 20%, 30%, 40%, 50%, 60%, 70%, 80%, 90% or more of the main body of the ingot has been formed. Stated another way, this interface may occur after about 10%, 20%, 30%, 40%, 50%, 60%, 70%, 80%, 90% or more of the melt has been depleted or solidified.

II. Process Parameters

A. Crucible Rotation (CR)

Figure 9:
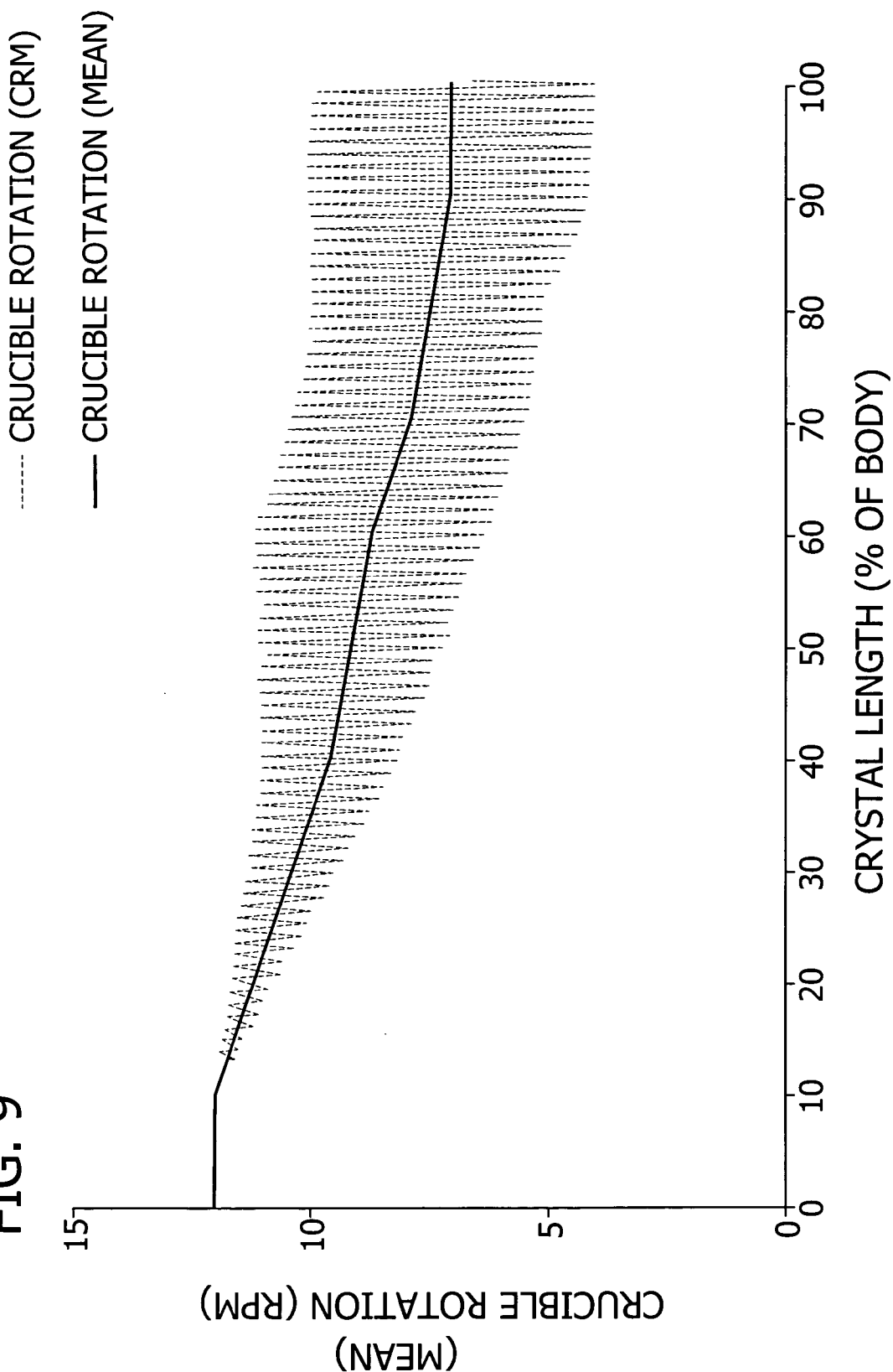
FIG. 9 is a graph which illustrates crucible rotation rate, as well as the modulation thereof, in accordance with one embodiment of the present process, as further described in the Example.

In accordance with the present process, once preparation of the silicon melt is complete and a seed crystal is brought into contact therewith, using means known in the art and/or described further herein, a mean crucible rotation rate (the crucible typically rotated in a direction opposite that of the co-axial seed crystal) is controlled, and more specifically decreased, as the seed crystal is withdrawn therefrom to grow the constant diameter portion of the ingot in order to control $G_0$, and more specifically to increase $G_0$ at or near the central axis of the growing constant diameter portion while $G_0$ at or near the edge or lateral surface thereof remains substantially unchanged, as compared to standard or convention processes wherein crucible rotation rate is not utilized for the purpose of controlling $G_0$ (e.g., wherein crucible rotation rate remains substantially constant or increases as a function of length of the constant diameter portion, for the purpose of controlling oxygen content), as illustrated by FIGS. 3 and 9 (see also U.S. Pat. Nos. 5,593,498; 5,766,341; 5,215,620; 4,040,895; 4,436,577 and 5,178,720, all of which are incorporated herein by reference, wherein CR is constant or increased as a function of axial length). Further, the present process employs crucible rotation rate modulation (CRM) to ensure a substantially uniform or constant oxygen content in the constant diameter portion of the ingot as a function of axial length thereof (see, e.g., FIG. 11).

In this regard it is to be noted that, as used herein, "mean" crucible rotation rate refers to the value of the rotation rate at a given axial position which is substantially equally between maximum and minimum values of the instantaneous crucible rotation rate in a modulation cycle; that is, the mean value is the value in the middle of a crucible rotation rate maximum and minimum values which immediately precede or follow each other, as part of a modulation cycle. Further, when crucible rotation rate modulation is employed, the instantaneous crucible rotation rate and the mean crucible rotation rate are essentially the same.

In the present process, a single crystal silicon ingot having a nominal diameter of about 150 mm, 200 mm, 300 mm or more is prepared by decreasing the mean crucible rotation rate (CR) as at least a portion of the constant diameter portion of the ingot is grown (e.g., at least about 50%, 60%, 70%, 80%, 90%, 95% or even about 100% of the total axial length of the constant diameter portion). For example, in accordance with one embodiment of the present process, the constant diameter portion of the ingot has (i) a length, L, as measured along the axis of the ingot from a transition from the seed-cone to the constant diameter portion, (ii) a first series of positions, $P_{(1 \to n)}$, located a distance, $D_{(1 \to n)}$, respectively, from the transition along the axis determined as a fraction of L, and (iii) a second series of positions, $PP^{(1 \to n)}$, located a distance, $DD^{(1 \to n)}$, respectively, from the transition along the axis determined as a fraction of L, wherein positions and their respective distances in the second series may be the same or different from those in the first. The process comprises, in part, decreasing the mean crucible rotation rate (CR) as a function of increasing axial length of the constant diameter portion of the ingot wherein the mean crucible rotation rate at a position, $P_1$, is greater than the mean crucible rotation rate at a position, $P_2$, wherein $D_2 \geq (D_1 + 0.1 \text{ L})$.

In this regard it is to be noted that positions $P_1$ and $PP^1$ may, independently, be at the transition, wherein growth of the constant diameter portion of the ingot begins or is initiated (i.e., at 0 L), or alternatively at any point along the axial length of the constant diameter portion of the ingot (e.g., at about 0.1 L, 0.2 L, 0.3 L, 0.4 L, 0.5 L, 0.6 L, 0.7 L, 0.8 L, or 0.9 L). Accordingly, in some embodiments, $D_2$ may be about 0.9 L, 0.8 L, 0.7 L, 0.6 L, 0.5 L, 0.4 L, 0.3 L, 0.2 L, or less, with $D_1$ being therefore, respectively, at least 0.1 L less. For example:

when $D_2$ is about 0.9 L, $D_1$ may be about 0.8 L or less (e.g., about 0.7 L, 0.6 L, 0.5 L, 0.4 L, 0.3 L, 0.2 L, 0.1 L or less);

when $D_2$ is about 0.8 L, $D_1$ may be about 0.7 L or less (e.g., about 0.6 L, 0.5 L, 0.4 L, 0.3 L, 0.2 L, 0.1 L or less);

when $D_2$ is about 0.6 L, $D_1$ may be about 0.5 L or less (e.g., about 0.4 L, 0.3 L, 0.2 L, 0.1 L or less);

when $D_2$ is about 0.4 L, $D_1$ may be about 0.3 L or less (e.g., about 0.2 L, 0.1 L or less); and, when $D_2$ is about 0.2 L, $D_1$ may be about 0.1 L or less.

In some embodiments, a decrease in crucible rotation rate does not begin upon initiation of growth of the constant diameter portion. Rather, in some instances it may increase, or alternatively remain constant, during growth of about the first 5% (0.05 L), 10% (0.1 L) or even 15% (0.15 L) or 20% (0.2 L) of the constant diameter portion adjacent the seed-cone. In addition, the rotation rate of the crucible may not in all embodiments continue to decrease until growth of the end-cone is initiated, or more generally until growth of the constant diameter portion is terminated. Rather, in some instances the rate may increase, or alternatively remain constant, during growth of about the last 5% (0.05 L), 10% (0.1 L) or even 15% (0.15 L) or 20% (0.2 L) of the constant diameter portion adjacent the end opposite the seed-cone.

In some embodiments, CR may decrease substantially linearly between the noted portions or points of the crystal (e.g., between points $P_1$ and $P_2$), while in other embodiments CR may decrease in a substantially nonlinear manner. Regardless of the manner by which the rate decreases, within a given region wherein the rate is decreased (e.g., between a first and last region wherein CR is constant or increased, or alternatively between points $P_1$ and $P_2$), CR may decrease, for example, by at least about 10%, 20%, 30%, 40% 50%, 60%, 70%, 80% or even 90%; that is, the mean value of the crucible rotation rate at $P_2$ may be about 10%, 20%, 30%, 40% 50%, 60%, 70%, 80% or even 90% less than the mean value of the crucible rotation rate at $P_1$. In one exemplary embodiment (referring generally to FIG. 9), CR decreases as the constant diameter portion of the ingot is grown by, for example: (i) about 10%, 15% or even 20% when $P_1$ is about 0.1 L and $P_2$ is about 0.4 L; (ii) about 10%, 15% or even 20% when $P_1$ is about 0.4 L and $P_2$ is about 0.7 L; and (iii) about 5%, 10% or even 15% when $P_1$ is about 0.7 L and $P_2$ is about 0.9 L.

It is to be noted that the precise values for crucible rotation rates may vary, for example, as a function of crucible size, ingot diameter, hot zone design, etc. (i.e., those parameter which have an effect on the thermal gradient of the melt and/or crystal). As such, CR may generally fall within the range of rotation rates utilized in Czochralski-type growth processes. Typically, however, CR ranges from about 1 to about 20 rpm, from about 5 to about 15 rpm, or about 7 to about 12 rpm during growth of the main body, or the portion of interest thereof. More specifically, for some embodiments CR may range from about 10 to 15 rpm during growth of about the first 5% (0.05 L), 10% (0.1 L), 20% (0.2 L), 30% (0.3 L), 40% (0.4 L), 50% (0.5 L) or more of the main body; stated another way, CR may range from about 10 to 15 rpm during growth of about the first 5% to 50%, about 10% to 40%, or about the first 15% to about 30%. Further, in the same or alternative embodiments, CR may range from about 5 to about 10 rpm, or from about 6 to about 8 rpm, during growth of essentially the remainder of the main body (e.g., about the last 95%, 90%, 80%, 70%, 60%, 50% or less). In one preferred embodiment, when $P_1$ is at a axial position between about 0.1 L and 0.4 L (i.e., $D_1$ is between about 0.1 L and 0.4 L), CR may have a value in the range of about 10 to about 15 rpm, or 11 to 13 rpm. Further, when $P_2$ is at a axial position between about 0.6 L and 0.9 L (i.e., $D_2$ is between about 0.6 L and 0.9 L), CR may have a value in the range of about 5 to about 10 rpm, or 6 to 8 rpm.

B. Crucible Rotation Modulation (CRM)

As previously noted, any reduction in the ability to control oxygen content resulting from using the mean crucible rotation rate to alter $G_0(r)$ (i.e., the average axial temperature gradient as a function of radius of the constant diameter portion of the ingot) may be offset or compensated for by the use of crucible rotation rate modulation (CRM); that is, it has been discovered that while CR may have a substantial impact on the type and quality of the single crystal silicon being grown, CRM generally does not and, therefore, the average oxygen content of the constant diameter portion, or the segment of interest thereof, may be controlled by modulating the crucible rotation rate. In this way, the average oxygen content of the constant diameter portion of the ingot, or segment thereof, may be controlled in the absence of, for example, an applied magnetic field (see, e.g., U.S. Pat. Nos. 5,178,720 and 6,458,204).

Figure 11:
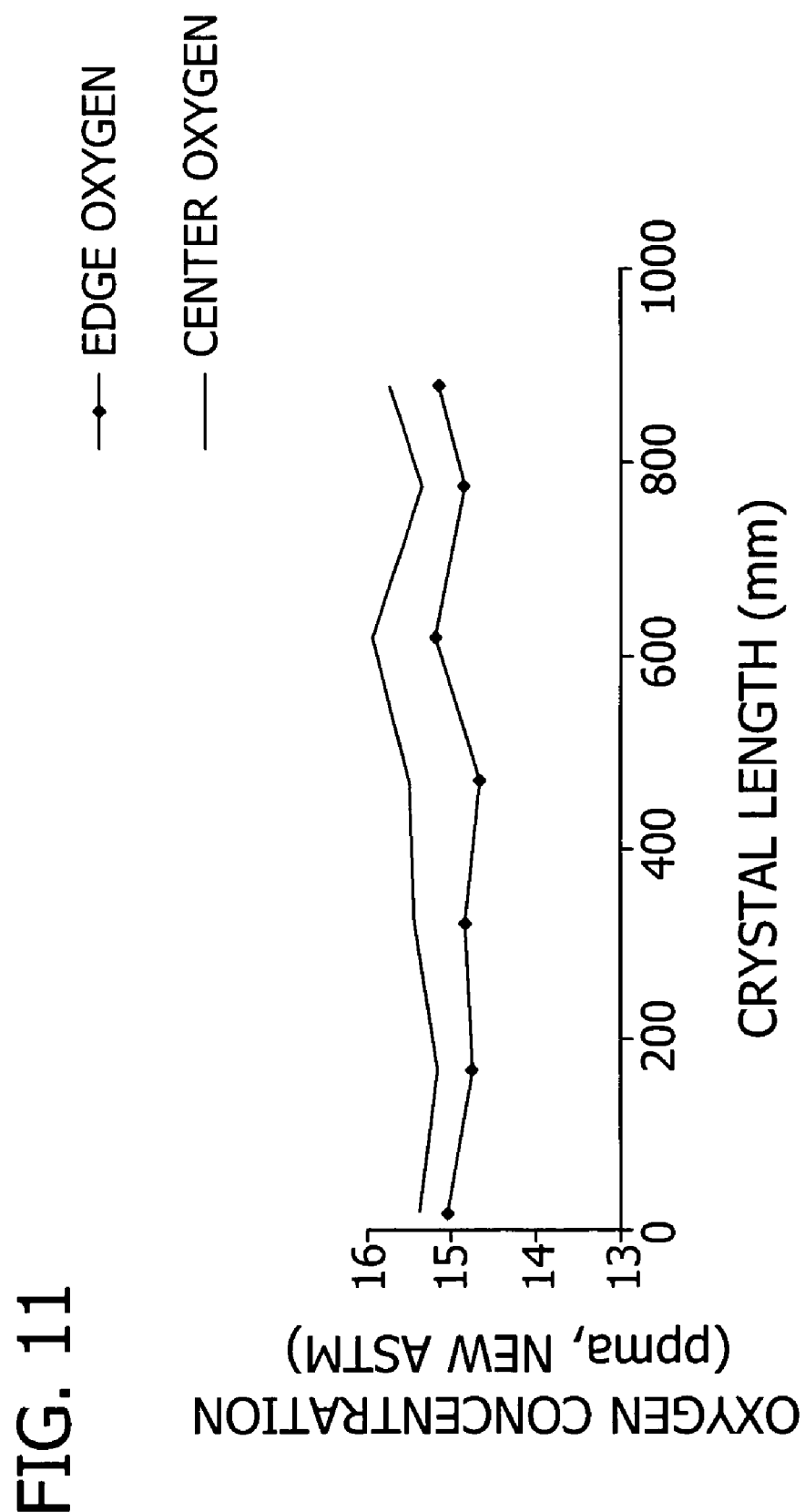
FIG. 11 is a graph illustrating an oxygen concentration profile in a single crystal silicon ingot that may be obtained using one embodiment of the present process.

Referring to FIG. 11, for example, the average oxygen content of the ingot, or segment of interest thereof, may be controlled in accordance with the present invention to essentially fall anywhere within the range achievable by Czochralski-type growth processes; that is, the average oxygen content may be about 10 PPMA, 12 PPMA, 14 PPMA, 16 PPMA or even about 18 PPMA (per ASTM F-121-83). Further, this oxygen content may be controlled using CRM such that it is substantially constant axially; that is, the average oxygen content may be controlled using CRM such that it varies by less than about 10%, 5%, 4%, 3%, 2%, 1% or even less as a function of the axial length of the constant diameter portion of the ingot, or segment of interest thereof.

Referring again to FIG. 9, although modulation of crucible rotation rate may be initiated at essentially any point during main body growth, typically it is not initiated at the beginning of constant diameter portion growth because oxygen content tends to be highest at this end, all other parameters being equal. Accordingly, in at least some embodiments CRM is not initiated until after about the first 5% (0.05 L), 10% (0.1 L), 15% (0.15 L), 20% (0.2 L) or more of the constant diameter portion has been grown.

In this regard it is to be noted that, without being held to any particular theory, it is generally believed that the rapid change in acceleration and speed of the crucible caused by the modulation profile decreases the oxygen diffusion boundary layer thickness in the silicon melt near the crucible wall. This enriches the silicon melt with oxygen and increases the oxygen concentration in the growing constant diameter portion of the ingot through segregation at the silicon melt-solid interface. Accordingly, the modulation profile is added to the speed signal during portions of the pull where the oxygen concentration in the constant diameter portion would otherwise be low. Because the oxygen concentration is highest during the initial portion of the constant diameter portion, which is believed at least in part to be due to the high degree of contact between the melt and the crucible surface, it is believed that there is no need for increasing the oxygen concentration and so the modulation profile is typically not added to the speed signal. Following growth of the early portion of the constant diameter portion, however, the oxygen concentration begins to decrease, due to the decreasing melt level, and so the modulation profile is slowly phased in to increase the oxygen concentration and substantially reduce the axial oxygen gradient.

In this regard it is to be noted that CR control and modulation may be achieved using means known in the art (see, e.g., U.S. Pat. Nos. 5,766,341 and 5,593,498, both of which are incorporated herein by reference).

In at least some embodiments, the amplitude of modulation increases as a function of constant diameter portion axial length. More specifically, as previously noted, the constant diameter portion of the ingot has (i) a length, L, as measured along the axis of the ingot from a transition from the seed-cone to the constant diameter portion, (ii) a first series of positions, $P_{(1 \to n)}$, located a distance, $D_{(1 \to n)}$, respectively, from the transition along the axis determined as a fraction of L, and (iii) a second series of positions, $PP^{(1 \to n)}$, located a distance, $DD^{(1 \to n)}$, respectively, from the transition along the axis determined as a fraction of L, wherein positions and their respective distances in the second series may be the same or different from those in the first. The process thus comprises controlling the average axial oxygen content in the constant diameter portion of the ingot to be substantially constant by CRM, wherein the amplitude of CRM at a position, $PP^1$, is less than the amplitude at a position, $PP^2$, wherein $DD^2 \geq DD^1$.

In some embodiment of the process, $DD^2 \geq (DD^1 + 0.1 \text{ L})$. For example, $DD^2$ may be about 0.9 L, 0.8 L, 0.7 L, 0.6 L, 0.5 L, 0.4 L, 0.3 L, 0.2 L, or less, with $DD^1$ being therefore, respectively, at least 0.1 L less. For example:

when $DD^2$ is about 0.9 L, $DD^1$ may be about 0.8 L or less (e.g., about 0.7 L, 0.6 L, 0.5 L, 0.4 L, 0.3 L, 0.2 L, 0.1 L or less);

when $DD^2$ is about 0.8 L, $DD^1$ may be about 0.7 L or less (e.g., about 0.6 L, 0.5 L, 0.4 L, 0.3 L, 0.2 L, 0.1 L or less);

when $DD^2$ is about 0.6 L, $DD^1$ may be about 0.5 L or less (e.g., about 0.4 L, 0.3 L, 0.2 L, 0.1 L or less);

when $DD^2$ is about 0.4 L, $DD^1$ may be about 0.3 L or less (e.g., about 0.2 L, 0.1 L or less); and, when $DD^2$ is about 0.2 L, $DD^1$ may be about 0.1 L or less.

The degree to which the crucible rotation rate is increased or decreased is essentially equal at any given axial position. For example, CRM amplitude may range from about 1% to about 50% or more above and below mean crucible rotation rate at a given axial position within the constant diameter portion of the ingot, or alternatively from about 5% to about 40%, from about 10% to about 30%, or from about 15% to about 25%. In one preferred embodiment, crucible rotation rate modulation has the shape of a sine wave (the rotation speed of the crucible increasing and decreasing as a function of the value of a sine wave).

Figure 12:
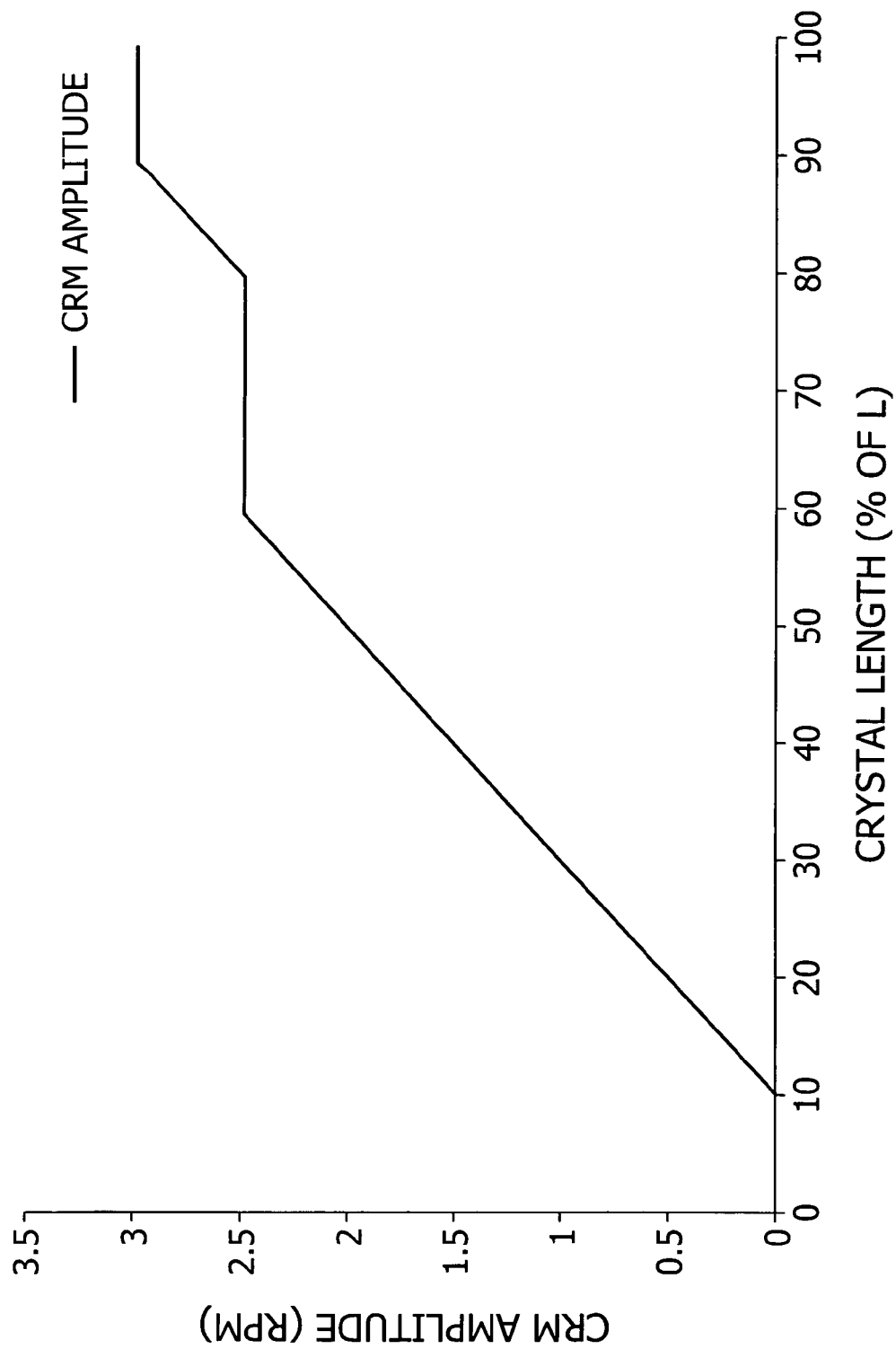
FIG. 12 is a graph which illustrates a profile for CRM amplitude as a function of axial length of the constant diameter portion of the ingot, for one embodiment of the present invention.

Referring now to FIGS. 9 and 12, it is to be noted that in at least some embodiments CRM does not begin upon initiation of growth of the constant diameter portion. Rather, in some instances crucible rotation rate modulation may be initiated after about the first 5% (0.05 L), 10% (0.1 L) or even 15% (0.15 L) or 20% (0.2 L) of the constant diameter portion adjacent the seed-cone has been grown. In addition, it is to be noted that amplitude of CRM may not in all embodiments continue to increase until growth of the end-cone is initiated, or more generally until growth of the constant diameter portion is terminated. Rather, in some instances the amplitude may decrease, or alternatively remain constant, during growth of about the last 5% (0.05 L), 10% (0.1 L) or even 15% (0.15 L) or 20% (0.2 L) of the constant diameter portion adjacent the end opposite the seed-cone.

In some embodiments, amplitude of CRM may increase substantially linearly between the noted portions or points of the crystal (e.g., between points $PP^1$ and $PP^2$), while in other embodiments amplitude of CRM may increase in a substantially nonlinear manner. Regardless of the manner by which the amplitude increases, within a given region wherein the amplitude is increased (e.g., between a first and last region wherein amplitude of CRM is essentially zero, constant or decreasing, or alternatively between points $PP^1$ and $PP^2$), amplitude of CRM may increase, for example, by at least about 1.25×, 1.5×, 2×, 3×, 4×, 5×, 6× or more; that is, the amplitude of CRM at $PP^2$ may be about 2 times, 3 times, 4 times, 5 times, 6 times or more the amplitude of CRM at $PP^1$. In one exemplary embodiment (referring generally to FIG. 11), the amplitude of CRM increases as the constant diameter portion of the ingot is grown to control the oxygen content therein by, for example: (i) about 2× or 3× when $PP^1$ is about 0.2 L and $PP^2$ is about 0.4 L; (ii) about 1.5× or 2× when $PP^1$ is about 0.4 L and $PP^2$ is about 0.6 L; and (iii) about 1.25× or 1.5× when $PP^1$ is about 0.6 L and $PP^2$ is about 0.9 L.

Actual values for the magnitude and duration or period of CRM may generally fall essentially anywhere within the range of modulation rates utilized in Czochralski-type growth processes to achieve the desired oxygen content. Typically, however, the amplitude of CRM ranges from about 0.1 rpm to about 10 rpm, from about 1 to about 9 rpm, from about 2 to about 8 rpm, or about 3 to about 5 rpm; that is, the mean crucible rotation rate is increased and/or decreased by about 1 to about 10 rpm, about 2 to about 8 rpm, or about 3 to about 5 rpm. For example, in one preferred embodiment, when $PP^1$ is at a axial position between about 0.1 L and 0.4 L (i.e., $DD^1$ is between about 0.1 L and 0.4 L), amplitude of CRM may have a value in the range of greater than about 0 rpm (e.g., 0.1 rpm) to about 2 rpm or less, or from about 0.5 to about 1.5 rpm. Further, when $PP^2$ is at a axial position between about 0.6 L and 0.9 L (i.e., $DD^2$ is between about 0.6 L and 0.9 L), amplitude of CRM may have a value in the range of greater than about 2 to about 4 rpm, or 2.5 to 3.5 rpm.

In this regard it is to be noted that, as used herein, amplitude refers to the maximum or minimum value of the instantaneous crucible rotation rate in a single modulation cycle.

With respect to the frequency of modulation, this is preferably sufficiently high to prevent both thermal and mechanical fluctuations at the melt level which could detrimentally affect the growing seed or crystal. Accordingly, the period of modulation typically ranges from about 10 to about 120 seconds, from about 30 to about 90 seconds, or from about 45 to about 75 seconds.

With respect to oxygen content control, it is to be noted that, in general, higher oxygen contents are obtained when larger amplitude modulation profiles are employed, while lower oxygen contents are obtained when smaller amplitude modulation profiles are employed.

It is to be further noted that the manner and degree to which CR is modulated may be other than herein described without departing from the scope of the present invention. (See, e.g., U.S. Pat. Nos. 5,766,341 and 5,593,498, the entire contents of which are incorporated herein by reference.) For example, in alternative embodiments, crucible rotation may be modulated as a function of a pulsed square wave or a triangular wave. (See, e.g., U.S. Pat. No. 5,215,620.)

It is to be still further noted that, in accordance with the present process, control of CR and CRM enables throughput of large diameter single crystal silicon ingots to be increased, as compared to conventional processes wherein CR, and optionally CRM, are controlled simply for purposes of maintaining oxygen content of the ingots. Without being held to a particular theory, it is believed that, at least in part, this increased throughput is the result a process wherein $G_0$ at or near the central axis is increased (having a value in some embodiments of, for example, at least about 2° C./mm, 2.25° C./mm, 2.5° C./mm or more), while $G_0$ at or near the lateral surface or radial edge of the constant diameter portion of the ingot is substantially unchanged (having a value in some embodiments of, for example, 4° C./mm, 4.25° C./mm, 4.5° C./mm or more).

III. Substantially Defect-Free Growth

A. Defect-free Silicon

Previously, it has been reported that process conditions can be controlled during growth of a single crystal silicon ingot, prepared in accordance with the Czochralski method, such that the constant diameter portion of the ingot contains a region or segment which is substantially free of agglomerated intrinsic point defects. (See, e.g., U.S. Pat. Nos. 5,919,302; 6,254,672; 6,287,380; 6,328,795; and, 6,312,516, all of which are incorporated herein by reference.) As disclosed therein, growth conditions, including growth velocity, v, the average axial temperature gradient, $G_0$, between the temperature of solidification and a temperature greater than about 1300° C. (i.e., at least about 1325° C., at least about 1350° C. or even at least about 1375° C.), and optionally the cooling rate from solidification to a temperature at which silicon self-interstitial or vacancy intrinsic point defects are essentially no longer mobile within a commercially practical period of time (e.g., less than about 1100° C., 1050° C., 1000° C., 900° C., or even 800° C.), are controlled to cause the formation of (i) an interstitial-dominated, axially symmetric region extending radially inward from the circumferential or lateral edge of the constant diameter portion of the ingot, and/or (ii) a vacancy-dominated, axially symmetric region which has a width of at least about 15 mm or which includes the central axis of the ingot, which is substantially free of agglomerated intrinsic point defects.

As disclosed in the above-noted references and as further described and illustrated herein (see, e.g., FIGS. 10A, 10B and 10C and related discussion herein), growth conditions can in some cases be controlled to maximize the volume of one of these axially symmetric region relative to the volume of the constant diameter portion of the ingot (e.g., the particular region of interest having a radial width about equal to the radius of the constant diameter portion of the ingot). Alternatively, however, these axially symmetric regions may have a width which is less than about equal to the radius of the constant diameter portion of the ingot. For example, when the interstitial dominated, axially symmetric region has a width less than about equal to the constant diameter portion of the ingot, this region may have a radial width, as measured from the lateral edge toward the central axis, equal to about 10% or 20% of the radius of the ingot, with widths of about 30%, 40%, 60%, 80%, 90% or even about 95% being possible. Furthermore, this axially symmetric region can extend over a length of at least about 10% or 20% of the constant diameter portion of the ingot, with lengths of at least about 30%, 40%, 60%, 80%, 90%, 95% or even about 100% being possible.

Similarly, when the width of the vacancy dominated, axially symmetric region is less than about equal to the width of the constant diameter portion of the ingot, in some embodiments this region may have a radial width, as measured from the vacancy-interstitial boundary toward the central axis, equal to about 10% or 20% of the radius of the ingot, with widths of about 30%, 40%, 60%, 80%, 90% or even about 95% being possible. Furthermore, this axially symmetric region can extend over a length of at least about 10% or 20% of the constant diameter portion of the ingot, with lengths of at least about 30%, 40%, 60%, 80%, 90%, 95% or even about 100% being possible.

It is to be noted in this regard that when the substantially defect free, vacancy dominated region does not extend to or include the center of the ingot, a vacancy dominated core region which contains agglomerated defects may be present. It is to be still further noted that, in some embodiments wherein the interstitial dominated region has a width which is less than equal to the radius of the ingot, a vacancy dominated, agglomerated defect-containing or defect-free region may be present radially inward of the interstitial dominated region; that is, in some embodiments, an interstitial dominated, axially symmetric region may surround a vacancy dominated region which does or does not contain agglomerated vacancy defects.

Additionally, in alternative embodiments, both the vacancy dominated and the interstitial dominated regions may be present, the vacancy dominated region being generally located radially inward of the interstitial dominated region; that is, when both regions are present, the vacancy dominated region will extend radially inward from the interstitial dominated region toward the central axis of the ingot. Accordingly, as the radial width of the interstitial dominated region increases, the radial width of the vacancy-dominated region decreases, and vice versa. In some embodiments, the combined width of the two regions will be substantially equal to the width of the constant diameter portion of the ingot; that is, in some embodiment a vacancy dominated core region which contains agglomerated vacancy defects is, not present. In all instances, the length of this combined, defect-free region is as described above (e.g., about 10%, 20%, 30%, 40%, 60%, 80%, 90%, 95% or even 100% of the length of the constant diameter portion of the ingot).

B. Control of $v/G_0$ and Cooling Rate

As described in the previously-noted references (i.e., those in section A, above), and as further described herein, it is generally believed that the formation of such an axially symmetric region or regions is achieved as a result of suppressing the reactions in which silicon self-interstitial (or in some cases crystal lattice vacancy) intrinsic point defects react to produce agglomerated intrinsic point defects. This suppression is achieved by controlling the concentration of these intrinsic point defects in the axially symmetric region or regions during the growth, and optionally the cooling, of the ingot to ensure the region or regions never become critically supersaturated. Preventing critical supersaturation, or the agglomeration of intrinsic point defects, can be achieved by establishing an initial concentration (controlled by $v/G_0(r)$, where $G_0$ is a function of radius) which is sufficiently low, such that critical supersaturation is never achieved. Such an approach can be limiting, however, because it requires that the actual value of $v/G_0$ be maintained within a narrow target range of values very close to the critical value of $v/G_0$.

Fortunately, due to the relatively large mobility of self-interstitials (generally about $10^{-4}$ cm$^2$/second), it is possible to effectively suppress the concentration of intrinsic point defects over relatively large distances (e.g., distances of about 3 cm, 5 cm, 8 cm, to about 10 cm or more), by the radial diffusion of self-interstitials to sinks located at the crystal surface or to vacancy-dominated regions located within the crystal. Radial diffusion can be effectively used to suppress the concentration of self-interstitials (and in some cases vacancies), provided sufficient time is allowed for the radial diffusion of the initial concentration of intrinsic point defects. In general, the diffusion time will depend upon the radial variation in the initial concentration of intrinsic point defects, with lesser radial variations requiring shorter diffusion times.

Such radial diffusion can be achieved by means of controlled cooling. As a result, controlled cooling can be employed to increase the residence time of a given segment of the ingot within a temperature range at which intrinsic point defects are mobile, in order to allow more time for the point defects to diffuse to sites where they can be annihilated. As further described in, for example, U.S. Pat. No. 6,312,516 (which is incorporated herein by reference), controlled cooling can employed to significantly expand the range of values for $v/G_0$ which can be used while still avoiding the formation of agglomerated defects. As noted therein, controlled cooling can be used to allow $v/G_0$ to vary or "wander" over the length of the ingot by at least about 5%, 10%, 15%, 20% or more.

Alternatively, however, it is to be noted that rapid cooling may also be employed to prevent the formation of agglomerated intrinsic point defects. (See, e.g., U.S. patent application Ser. No. 09/661,745, filed Sep. 14, 2000, which is incorporated herein by reference.) In this instance, a given segment of the constant diameter portion of the ingot is "quenched," or rapidly cooled, through the temperature range at which the predominant intrinsic point defects would otherwise agglomerate to form defects. By limiting the amount of time such point defects are allowed to diffuse and agglomerate with other point defects, the formation of agglomerated vacancy or self-interstitial defects can be prevented.

In accordance with one embodiment of the present invention, the growth velocity, v, and the average axial temperature gradient, $G_0$, are typically controlled such that the ratio $v/G_0$ ranges in value from about 0.5 to about 2.5 times the critical value of $v/G_0$ (i.e., about $1 \times 10^{-5}$ cm$^2$/sK to about $5 \times 10^{-5}$ cm$^2$/sK based upon currently available information for the critical value of $v/G_0$). However, in some embodiments the ratio $v/G_0$ will range in value from about 0.6 to about 1.5 times the critical value of $v/G_0$ (i.e., about $1.3 \times 10^{-5}$ cm$^2$/sK to about $3 \times 10^{-5}$ cm$^2$/sK based upon currently available information for the critical value of $v/G_0$). In one particularly preferred embodiment, wherein an interstitial dominated region extends from the edge to the central axis of the ingot, the ratio $v/G_0$ ranges from about 0.75 to about 1 times the critical value of $v/G_0$ (i.e., about $1.6 \times 10^{-5}$ cm$^2$/sK to about $2.1 \times 10^{-5}$ cm$^2$/sK based upon currently available information for the critical value of $v/G_0$). In a second particularly preferred embodiment, wherein a vacancy dominated region extends from the edge to the central axis of the ingot, the ratio $v/G_0$ ranges from about 1 to about 1.1 times the critical value of $v/G_0$ (i.e., about $2.1 \times 10^{-5}$ cm$^2$/sK to about $2.3 \times 10^{-5}$ cm$^2$/sK based upon currently available information for the critical value of $v/G_0$). As further described herein, these ratios are achieved by controlling the average axial temperature gradient, $G_0$, relative to the growth velocity, v.

In general, control of the average axial temperature gradient, $G_0$, may be achieved through, for example, the design of the "hot zone" of the crystal puller (i.e., the graphite, or other materials, that makes up the heater, insulation, heat and radiation shields or reflectors, among other things). Although the design particulars may vary depending upon the make and model of the crystal puller, in general, $G_0$ may be controlled using any of the means currently known in the art for controlling heat transfer at the melt-solid interface, including reflectors, insulation rings, radiation shields, purge tubes, light pipes, and heaters. In general, radial variations in $G_0$ are minimized by positioning such an apparatus within about one crystal diameter above the melt-solid interface. In addition, $G_0$ may be further controlled by adjusting the position of the apparatus relative to the melt (typically expresses as a distance, Hr) and/or crystal (prior to and/or during crystal growth). This is accomplished either by adjusting the position of the apparatus in the hot zone (relative to the surface of the melt, for example) or by adjusting the position of the melt surface in the hot zone (relative to the device used for controlling heat transfer, for example), by means known in the art, including for example the use of: (i) a vision system and a method for measuring the melt level/position inside the crystal pulling apparatus during ingot growth relative to, for example, a reflector positioned above the melt, as described by for example R. Fuerhoff et al. in U.S. Pat. No. 6,171,391 (which is incorporated herein by reference); (ii) a lift or drive mechanism for raising/lowering the heat transfer control device (see, e.g., U.S. Pat. No. 5,853,480, which is incorporated herein by reference); and/or (iii) a lift or drive mechanism for raising/lowering the crucible which contains the melt, in those instances wherein, for example, the reflector is in a fixed position above the melt surface. However, in accordance with the present invention, $G_0$ is controlled, or additionally controlled, by means of adjusting the mean crucible rotation rate (CR), as describe herein above.

After solidification, the concentration of intrinsic point defects in the crystal is preferably reduced by permitting diffusion of the intrinsic point defects, and to the extent applicable, mutual annihilation of point defects. In general, diffusion of the predominant intrinsic point defects to the lateral crystal surface will be the principal means for reduction if the ingot is vacancy or interstitial dominated from the center to the lateral surface of the ingot. If, however, the ingot contains a vacancy dominated core surrounded by an axially symmetric interstitial dominated region, the reduction will primarily be a combination of outward diffusion of interstitials to the surface and inward diffusion of interstitials to the vacancy dominated region where they are annihilated. The concentration of such intrinsic point defects may thus be suppressed to prevent an agglomeration event from occurring.

The amount of time allowed for diffusion of the intrinsic point defects to the surface of the silicon or for their annihilation (i.e., the combination of interstitials with vacancies) as the single crystal cools from the temperature of solidification to the temperature of nucleation is, in part, a function of the initial concentration of intrinsic point defects, and, in part, a function of the cooling rate through the nucleation temperature for agglomerated defects. Various approaches may be employed in this manner to avoid defect formation (see, e.g., U.S. Pat. Nos. 6,328,795; 6,312,516; 6,287,380; 6,254,672 and 5,919,302; as well as U.S. patent application Ser. No. 09/661,745 (filed Sep. 14, 2000); all of which are incorporated herein by reference).

For example, in the absence of a rapid cooling step, agglomerated defects can generally be avoided if the ingot is cooled from the solidification temperature to a temperature within about 50° C., 25° C., 15° C. or even 10° C. of the nucleation temperature over a period of (i) at least about 5 hours, preferably at least about 10 hours, and more preferably at least about 15 hours for 150 mm nominal diameter silicon crystals, (ii) at least about 5 hours, preferably at least about 10 hours, more preferably at least about 20 hours, still more preferably at least about 25 hours, and most preferably at least about 30 hours for 200 mm nominal diameter silicon crystals, (iii) at least about 20 hours, preferably at least about 40 hours, more preferably at least about 60 hours, and most preferably at least about 75 hours for silicon crystals having a nominal diameter of 300 mm or greater. In addition to the "residence times" noted above, cooling of a given ingot segment may additionally, or alternatively, be considered in terms of a cooling rate. In some embodiments, therefore, cooling rates over the temperature range in which self-interstitials are mobile will typically range from about 0.1° C./minute to about 1.5° C./minute, from about 0.2° C./minute to about 1° C./minute, or from about 0.4° C./minute to about 0.8° C./minute.

It is to be noted that, in some embodiments, the crystal may be grown under conditions which ensure at least no portion of the constant diameter portion thereof cools to a temperature below the temperature at which agglomeration of intrinsic point defects in the constant diameter portion would otherwise occur during the time it is grown in order to ensure it is substantially free of agglomerated intrinsic point defects. (See, e.g., U.S. Pat. No. 6,328,795 for additional details.)

However, it is to be noted that the prevention of agglomerated defects may alternatively be achieved by a rapid cooling or "quench cooling" process. (See, e.g., U.S. patent application Ser. No. 09/661,745, filed Sep. 14, 2000, which is incorporated herein by reference.) More specifically, as an alternative to preventing agglomerated defect formation by slow cooling (in order to allow for diffusion, and thus suppression, of the intrinsic point defect concentration), a quench cooling process may be employed, wherein the ingot segment is quench-cooled through the temperature range (e.g., about 1200–1000° C.) within which agglomerated defects are nucleated at a rate of, for example, at least about 5, 10, 20, 30, 40, 50° C./min. or more. As a result, nucleation (and thus formation) of agglomerated defects is prevented.

Accordingly, for those segments of the ingot which will be rapidly cooled, the diffusion time allowed will typically be some fraction of the time noted above, with the fraction decreasing with increasing cooling rates, whereas the diffusion time allowed for those segments which are not rapidly cooled will be as described above. In some embodiments, as a percentage of the constant diameter portion of the ingot which is free of agglomerated defects, the segments which are rapidly cooled may constitute at least about 25%, 50%, 75%, 90% or even more.

Regardless of the approach, the ingot may optionally contain, in addition to the rapidly cooled segment, at least one section (from the lateral edge to some radial position) in which agglomeration reactions are avoided simply by controlling the initial concentration of intrinsic point defects, and optionally allowing adequate time for diffusion prior to reaching the nucleation temperature (as described herein).

IV. Hot Zones

It is to be noted that, in at least some embodiments, the process of the present invention may be employed in standard Czochralski-type pulling apparatus. More specifically, the present process may be employed to prepare single crystal silicon of various types and qualities using, for example, the crystal pulling apparatus as described in U.S. Pat. Nos. 5,593,498 and 5,766,341 (the entire contents of which are incorporated herein by reference).

However, as previously noted, the present process may be employed to prepare substantially defect-free single crystal silicon. In such embodiments, the present process may alternatively be employed in crystal pullers having "closed" or "slow cool" hot zones. More specifically, the present process may be employed in crystal pullers which including structural components which act to control thermal conditions of the growth process, as well as the cooling rate or residence time within a given temperature range, in order to avoid the formation of agglomerated intrinsic point defects, as described in greater detail above. (Further details for growing single crystal silicon which is substantially free of agglomerated defects is provided in, for example, U.S. Pat. Nos. 5,919,302; 6,254,672; 6,287,380; 6,328,795; and, 6,312,516. All matter disclosed in the foregoing patents is incorporated herein by reference for all purposes.)

V. Additional Material Features/Limitations:

A. Oxygen Content

For an ingot prepared in accordance with some embodiments of the process of the present process and having a V/I boundary, or more specifically having a region which is vacancy dominated, experience has shown that lower oxygen content material, i.e., less than about 13.5 PPMA (parts per million atomic, ASTM standard F-121-83) and typically ranging from about 13 PPMA to about 11 PPMA, may be preferred. Lower oxygen content material may be preferred because, in medium to high oxygen contents wafers (i.e., about 14 PPMA to about 18 PPMA), the formation of oxygen-induced stacking faults and bands of enhanced oxygen clustering just inside the V/I boundary may become more pronounced. Each of these are a potential source for problems in a given integrated circuit fabrication process. However, it is to be noted that, when the interstitial dominated, axially symmetric region has a width about equal to the radius of the ingot, the oxygen content restriction is removed because, given that no vacancy type material is present, the formation of vacancy-enhanced oxygen clusters will not occur.

It is to be noted, however, that in some instances the wafer may be subjected to a thermal anneal prior to further processing (such as prior to being subjected to an oxidation treatment wherein oxidation induced stacking faults are formed), in order to dissolve or otherwise alter nuclei present which lead to the formation of oxidation induced stacking faults. Stated another way, the process of the present invention may additionally include a thermal anneal, after the ingot segment has been grown and a wafer obtained therefrom, prior to an oxidation treatment, in order to limit or prevent the formation of oxidation induced stacking faults.

This thermal anneal, or rapid thermal anneal, may be carried out by a number of different means (see, e.g., U.S. Pat. Nos. 5,919,302; 5,994,761; 6,190,631; 6,254,672; 6,287,380; 6,328,795; and, 6,312,516; as well as U.S. patent application Ser. No. 09/661,821 (filed Sep. 14, 2000)). Generally speaking, however, such a treatment involves heating the wafer to a temperature of at least about 950° C., 1000° C., 1100° C., 1200° C. or more (e.g., from about 1250° C. to about 1270° C.) for a few seconds (e.g., 2, 4, 6, 8), tens of seconds (e.g., 10, 20, 30, 40), or even several minutes, depending upon the temperature employed and the size and/or number of nuclei to be dissolved.

B. Carbon Content

Substitutional carbon, when present as an impurity in single crystal silicon, has the ability to catalyze the formation of oxygen precipitate nucleation centers. For this and other reasons, therefore, it is preferred that, in at least some embodiments, the single crystal silicon ingot have a low concentration of carbon; that is, the concentration of carbon in the single crystal silicon is in some embodiments preferably less than about $5 \times 10^{16}$ atoms/cm$^3$, more preferably less than $1.5 \times 10^{16}$ atoms/cm$^3$, still more preferably less than $1 \times 10^{16}$ atoms/cm$^3$, and most preferably less than $3 \times 10^{15}$ atoms/cm$^3$, as determined by means standard in the art (e.g., room temperature FTIR).

C. Resistivity

It is generally known to those of skill in the art that the presence of a dopant in the silicon melt can impact the relative position of the V/I boundary (when present) in the single crystal silicon ingot. Without being held to any particular theory, it is generally believed that this is the result of a change in $G_0$ caused by high dopant concentrations (the changes resulting from, for example, boron-vacancy-oxygen interactions). Accordingly, in at least some embodiments, it is preferable that the dopant content of the silicon melt, and thus the single crystal silicon ingot formed therefrom, be such that the resistivity of the resulting single crystal silicon be greater about 0.1 ohm-cm (e.g., ranging from greater than about 1 ohm-cm to less than about 300 ohm-cm, or from about 1 to about 100 ohm-cm).

VI. Applications

It is to be noted that wafers which are sliced from ingots grown in accordance with the present invention are suitable primarily for use as polished wafers for device fabrication, but may also be used for substrates upon which an epitaxial layer may be deposited. Epitaxial deposition may be performed by means common in the art.

Furthermore, it is to be noted that wafers which are sliced from ingots grown in accordance with the present invention are also suitable for use as substrates for semiconductor on insulator structures. The semiconductor on insulator composite may be formed, for example, as described in Iyer et al., U.S. Pat. No. 5,494,849 (incorporated herein by reference). Alternatively, a single wafer may be used wherein molecular oxygen ions ($O_2^+$) or atomic oxygen ions ($O^+$) are implanted below the surface of the wafer to form an oxide layer (a process is generally referred to as SIMOX, i.e., separation by implantation of oxygen). (See, e.g., U.S. Pat. No. 5,436,175, which is incorporated herein by reference.)

Finally, it is also to be noted that wafers prepared in accordance with the present invention are suitable for use in combination with hydrogen or argon annealing treatments, such as the treatments described in European Patent Application No. 503,816 A1. Alternatively, wafers may be subjected to a thermal treatment which results in the formation of a non-uniform distribution of crystal lattice vacancies, enabling the wafers, during the heat treatment cycles of essentially any arbitrary electronic device manufacturing process, to form an ideal, non-uniform depth distribution of oxygen precipitates. (See, e.g., U.S. Pat. Nos. 5,994,761 and 6,180,220, which are incorporated herein by reference).

VII. A-Type and B-Type Interstitial Defects

In one embodiment of the present invention, the resulting ingot may contain an axially symmetric region which is substantially free of A-defects but which contains B-defects, a type of defect which forms in interstitial dominated material. While the precise nature and mechanism for the formation of B-defects is not known, it has become generally accepted that B-defects are agglomerations of silicon self-interstitials which are not dislocation loops. B-defects are smaller than A-defects (an agglomerated interstitial defect) and are generally thought not to be dislocation loops, but rather to be three dimensional agglomerations which have either not grown large enough or not reached a sufficient activation energy necessary to form dislocation loops.

At this point, it is not yet clear that B-defects when present in an active electronic device region would negatively impact the performance of that device. In any event, it has previously been discovered that B-defects can be readily dissolved by slicing the ingot into wafers and heat-treating the wafers, provided the B-defects have not previously been stabilized. (See, e.g., U.S. Pat. No. 6,391,662 and U.S. patent application Ser. No. 09/661,821, filed Sep. 14, 2000, both of which are incorporated herein by reference.)

Accordingly, it is to be noted that the process of the present invention is in part directed to the avoidance of agglomerated defects at or near the wafer surface which are known to impact the yield potential of the silicon material in the production of complex and highly integrated circuits, such agglomerated defects including agglomerated vacancy defects (e.g., D-defects) and A-defects which cannot be readily dissolved throughout the silicon wafer by a heat-treatment of the type which may be used to dissolve B-defects. Because B-defects can be readily dissolved and may not be deleterious in any event, in one embodiment the process of the present invention includes the preparation of single crystal silicon having an axially symmetric region which includes B-defects but is otherwise substantially free of agglomerated defects. In this instance, B-defects may be treated as if they are not an agglomerated intrinsic point defect. To the extent it is desired, however, that the single crystal silicon be substantially free of all agglomerated defects, including B-defects, the process includes the additional step of annealing wafers sliced from the B-defect containing ingot to eliminate them (as described in the above-noted U.S. patent application).

VIII. Detection of Agglomerated Defects

Agglomerated defects may be detected by a number of different techniques. (As noted in, for example, U.S. Pat. Nos. 5,919,302; 5,994,761; 6,190,631; 6,254,672; 6,287,380; 6,328,795; and, 6,312,516; as well as U.S. patent application Ser. No. 09/661,821 (filed Sep. 14, 2000)). For example, flow pattern defects, or D-defects, are typically detected by preferentially etching the single crystal silicon sample in a Secco etch solution for about 30 minutes, and then subjecting the sample to microscopic inspection. (see, e.g., H. Yamagishi et al., Semicond. Sci. Technol. 7, A135 (1992)). Although standard for the detection of agglomerated vacancy defects, this process may also be used to detect A-defects. When this technique is used, such defects appear as large pits on the surface of the sample when present.

Additionally, agglomerated intrinsic point defects may be visually detected by decorating these defects with a metal capable of diffusing into the single crystal silicon matrix upon the application of heat, using the method described in, for example, the above-cited U.S. patents and patent applications. In an alternative embodiment of this "defect decoration" process, the single crystal silicon sample is subjected to a thermal anneal prior to the application of the metal-containing composition in order to detect B-type defects, as described in for example, U.S. patent application Ser. No. 09/661,821 (filed Sep. 14, 2000).

In general, regions of interstitial and vacancy dominated material free of agglomerated defects can be distinguished from each other and from material containing agglomerated defects by the copper decoration technique described above. Regions of defect-free interstitial dominated material contain no decorated features revealed by the etching whereas regions of defect-free vacancy dominated material (prior to a high-temperature oxygen nuclei dissolution treatment as described above) contain small etch pits due to copper decoration of the oxygen nuclei.

IX. Definitions

As used herein, the following phrases or terms shall have the given meanings: "agglomerated intrinsic point defects" or simply "agglomerated defects" mean defects caused (i) by the reaction in which vacancies agglomerate to produce D-defects, flow pattern defects, gate oxide integrity defects, crystal originated particle defects, crystal originated light point defects, and other such vacancy related defects, or (ii) by the reaction in which self-interstitials agglomerate to produce A-defects, dislocation loops and networks, and other such self-interstitial related defects; "agglomerated interstitial defects" shall mean agglomerated intrinsic point defects caused by the reaction in which silicon self-interstitial atoms agglomerate (e.g., after becoming supersaturated, to reduce their total energy); "agglomerated vacancy defects" shall mean agglomerated vacancy point defects caused by the reaction in which crystal lattice vacancies agglomerate (e.g., after becoming supersaturated, to reduce their total energy); "radius" means the distance measured from a central axis to a circumferential or lateral edge of a wafer or ingot; "substantially free of agglomerated intrinsic point defects" shall mean a concentration (or size) of agglomerated defects which is less than the detection limit of these defects, which is currently about $10^3$ defects/cm$^3$; "V/I boundary" means the position along the radius (or axis) of an ingot or wafer at which the material changes from vacancy dominated to self-interstitial dominated; "vacancy dominated" and "self-interstitial dominated" mean material in which the intrinsic point defects are predominantly vacancies or self-interstitials, respectively; and, "main body" generally refers to the constant diameter portion of the ingot.

Additionally, it is to be noted that defects associated with the agglomeration of crystal lattice vacancies, or vacancy intrinsic point defects, include such observable crystal defects as D-defects, Flow Pattern Defects (FPDs), Gate Oxide Integrity (GOI) Defects, Crystal Originated Particle (COP) Defects, and crystal originated Light Point Defects (LPDs), as well as certain classes of bulk defects observed by infrared light scattering techniques (such as Scanning Infrared Microscopy and Laser Scanning Tomography).

Also present in regions of excess vacancies, or regions where some concentration of free vacancies are present but where agglomeration has not occurred, are defects which act as the nuclei for the formation of oxidation induced stacking faults (OISF). It is speculated that this particular defect, generally formed proximate the boundary between interstitial and vacancy dominated material, is a high temperature nucleated oxygen precipitate catalyzed by the presence of excess vacancy intrinsic point defects; that is, it is speculated that this defect results from an interaction between oxygen and "free" vacancies in a region near the V/I boundary.

Finally, it is to be noted that defects relating to self-interstitials are less well studied. They are generally regarded as being low densities of interstitial-type dislocation loops or networks. Such defects are not responsible for gate oxide integrity failures, an important wafer performance criterion, but they are widely recognized to be the cause of other types of device failures usually associated with current leakage problems.

The density of such vacancy and self-interstitial agglomerated defects in Czochralski silicon is conventionally within the range of about $1\times10^3/cm^3$ to about $1\times10^7/cm^3$. While these values are relatively low, agglomerated intrinsic point defects are of rapidly increasing importance to device manufacturers and, in fact, are now seen as yield-limiting factors in device fabrication processes.

- - - - -

EXAMPLE

For purposes of illustrating the process of the present invention, and more specifically the impact of CR and CRM control, two single crystal silicon ingots were prepared in the same hot zone and using the same or substantially similar pull rate profiles. (200 mm nominal diameter crystals, Ferrofludic CZ150 puller having a "closed" hot zone, or a hot zone designed to achieve process conditions as described herein, including a ratio $v/G_0$ and a cooling rate, sufficient to form an axially symmetric, defect-free segment of some radial width). Each crystal was grown to achieve an average oxygen content falling within the range of about 11 to about 13 PPMA.

Figure 8:
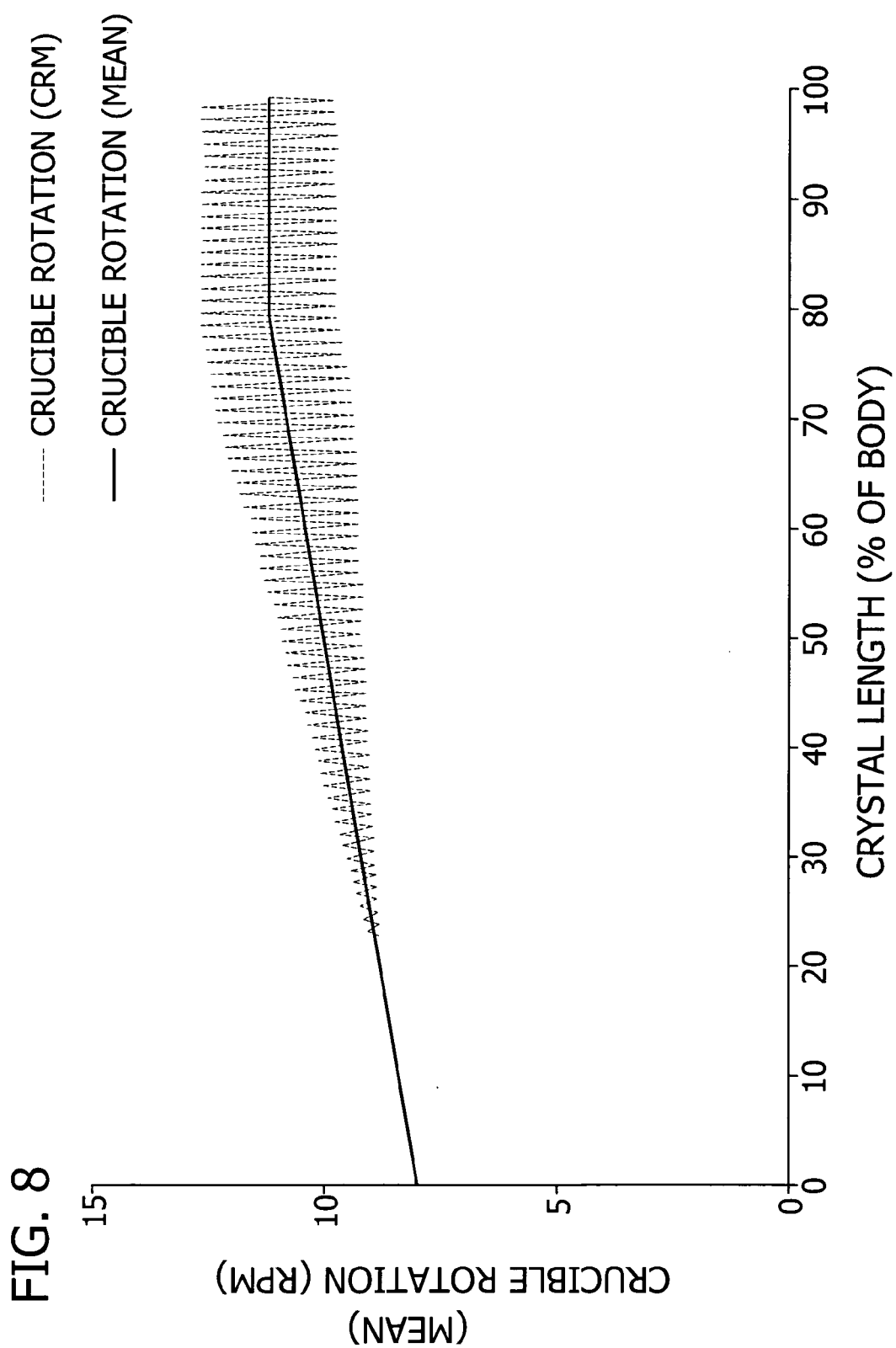
FIG. 8 is a graph which illustrates crucible rotation rate, as well as the modulation thereof, in a known growth process, as further described in the Example.

The first crystal, crystal A (with reference to FIG. 10A), was prepared using a CR and CRM profile similar to that which is illustrated in FIG. 8. As can be seen from FIG. 10A, this resulted in a crystal segment having a axially symmetric, defect-free region of interstitial dominated material surrounding a core having agglomerated vacancy defects therein. (The segment extended over an axial length of the constant diameter portion from about 0 L to about 0.3 L.)

The second crystal, crystal B (with reference to FIG. 10B), was prepared in a manner which differed from Crystal A essentially only with respect to the CR and CRM profile (not shown). As can be seen from the crystal segment in FIG. 10B, the change in the CR profile had the effect of extending the radial width of the interstitial-dominated, defect-free region across the entire radius of the ingot, as well as extending this region axially. (The segment extending over substantially the same axial length; i.e., from about 0 L to about 0.3 L.)

In view of the foregoing, a third crystal, crystal C (with reference to FIG. 10C), was prepared, wherein CR was further modified (as illustrated by the profile in FIG. 9) in order to increase the axial length of the interstitial-dominated, defect-free segment even further. (The segment again extending over substantially the same axial length; i.e., from about 0 L to about 0.3 L.)

Figure 10A:
FIGS. 10A, 10B and 10C are photocopies of images of axial cuts of segments of ingots prepared as described in the Example, following copper decoration and a defect-delineating etch.
Figure 10B:
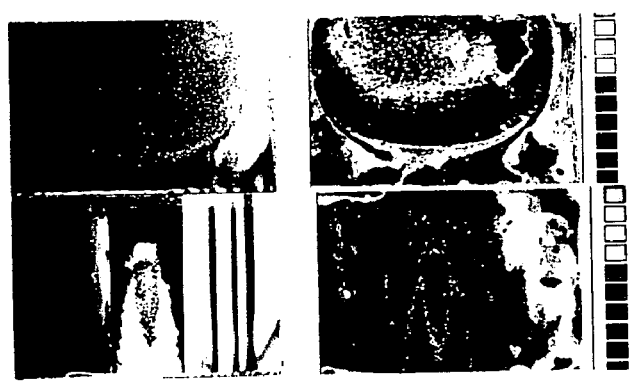
Figure 10C:
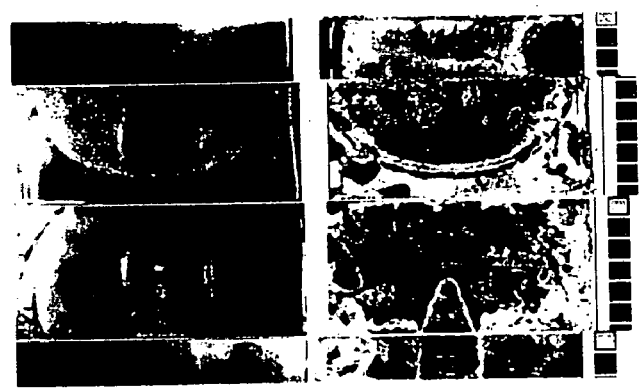

Without being held to a particular theory, and with reference to the FIGS. 10A, 10B and 10C, it is generally believed that as CR is altered, the melt-solid interface shape is altered and $G_0$ at or near the central axis of the ingot is decreased. As a result, the concentration of vacancies in the center of the growing crystal is decreased and/or the radial position of the critical value of $v/G_0$ (i.e., the point at which a transition occurs from self-interstitials to vacancies, or vice versa, as the predominant intrinsic point defect occurs), is moved radially inward. Eventually, the concentration of interstitials, relative to the concentration of vacancies, is sufficiently high and the residence time of the crystal segment within a temperature range in which self-interstitials are mobile is sufficiently long to allow the radially inward diffusion of self-interstitials for recombination with and annihilation of vacancies. As a result, the formation of agglomerated vacancy defects is suppressed.

In this regard, altering of the interface shape is further illustrated with reference to FIGS. 6A and 6B. The images present in FIGS. 6A and 6B are of crystal segments, obtained from Crystal A and C, respectively, or crystals similar thereto, after having undergone a process to reveal the interface shapes therein. More specifically, the crystal segments, after being axially cut, where:

1. subjected to a thermal anneal to enhance oxygen precipitation therein, wherein the crystal segments were heated at one or more temperatures in the range of about 500° C. to about 1000° C. for about 20 to about 30 hours in order to stabilize oxygen precipitate nuclei and then grow these nuclei into oxygen precipitates;
2. subsequently subjecting the crystal segments to a copper decoration process, using means known in the art, wherein (i) copper nitrate for example is applied to the surface, (ii) the coated sample is then heated to a temperature between about 850° C. and 1000° C. for about 5 to about 15 minutes, in order to diffuse metal into the sample, (iii) the heat-treated sample is then cooled and etched (e.g., Secco etch) to reveal decoration results; and, finally,
3. subsequently subjecting the decorated/etch samples to a semilab lifetime scan, using means known in the art (the scan revealing copper decorated interface shape with higher resolution).

(For additional details, see, e.g., the U.S. patents and patent applications referenced above under the heading therein "Detection of Agglomerated Defects.")

- - - - -

In view of the foregoing, it can be seen that $G_0$ can be altered during growth of a single crystal silicon ingot by means of controlling crucible rotation rate in a way not heretofore realized, while at the same time ensure uniformity in oxygen content by means of crucible rotation rate modulation. Additionally, the formation of agglomerated intrinsic point defects can optionally be suppressed, over significant portion of a single crystal silicon ingot, by means of controlling the ratio of $v/G_0$, and optionally the cooling rate or residence time of the ingot within the temperature range in which intrinsic point defects are mobile, by means of controlling $G_0$ through crucible rotation rate.

As various changes could be made in the above processes without departing from the scope of the present invention, it is intended that all matter contained in the above description and Example be interpreted as illustrative and not in a limiting sense.

What is claimed is:

1. A process for pulling a single crystal silicon ingot in accordance with the Czochralski method, wherein a seed crystal is brought into contact with a silicon melt contained within a crucible, which is coaxial with the seed, and then is withdrawn therefrom to form a neck adjacent the seed crystal, a seed-cone adjacent the neck, and a constant diameter portion adjacent the seed-cone, the constant diameter portion having (i) a nominal diameter of at least 150 mm, (ii) a length, L, as measured along the axis of the ingot from a transition from the seed-cone to the constant diameter portion, (iii) a first series of positions, $P_{(1 \rightarrow n)}$, located a distance, $D_{(1 \rightarrow n)}$, respectively, from the transition along the axis determined as a fraction of L, and (iv) a second series of positions, $PP^{(1 \rightarrow n)}$, located a distance, $DD^{(1 \rightarrow n)}$, respectively, from the transition along the axis determined as a fraction of L, wherein positions and their respective distances in the second series may be the same or different from those in the first, the process comprising:

rotating the seed crystal and the crucible in opposite directions;

decreasing a mean crucible rotation rate (CR) as a function of increasing axial length of the constant diameter portion of the ingot wherein the mean crucible rotation rate at a position, $P_1$, is greater than the mean crucible rotation rate at a position, $P_2$, wherein $D_2 \geq (D_1+0.1\ L)$; and, controlling an average axial oxygen content in the constant diameter portion to be substantially constant by crucible rotation rate modulation (CRM).

2. The process of claim 1 wherein $D_2$ is about 0.8 L.

3. The process of claim 2 wherein $D_1$ is less than about 0.6 L.

4. The process of claim 2 wherein $D_1$ is less than about 0.4 L.

5. The process of claim 1 wherein $D_2$ is about 0.6 L.

6. The process of claim 5 wherein $D_1$ is less than about 0.4 L.

7. The process of claim 5 wherein $D_1$ is less than about 0.2 L.

8. The process of claim 1 wherein CR decreases substantially linearly between positions $P_1$ and $P_2$.

9. The process of claim 1 wherein $D_1$ is about 0.1 L, CR being substantially constant from the transition to position $P_1$.

10. The process of claim 2 wherein CR is substantially constant from $P_2$ to about the end of the constant diameter portion of the ingot.

11. The process of claim 1 wherein CRM is increased as a function of increasing axial length of the constant diameter portion of the ingot.

12. The process of claim 11 wherein an amplitude of CRM at a position, $PP^1$, is less than the amplitude at a position, $PP^2$, wherein $DD^2 \geq DD^1$.

13. The process of claim 12 wherein $DD^2 \geq (DD^1+0.1\ L)$.

14. The process of claim 12 wherein $DD^2$ is about 0.8 L.

15. The process of claim 14 wherein $DD^1$ is less than about 0.6 L.

16. The process of claim 14 wherein $DD^1$ is less than about 0.4 L.

17. The process of claim 14 wherein $DD^1$ is less than about 0.2 L.

18. The process of claim 12 wherein $DD^2$ is about 0.6 L.

19. The process of claim 18 wherein $DD^1$ is less than about 0.4 L.

20. The process of claim 18 wherein $DD^1$ is less than about 0.2 L.

21. The process of claim 12 wherein $DD^2$ is about 0.4 L.

22. The process of claim 21 wherein $DD^1$ is less than about 0.2 L.

23. The process of claim 12 wherein $DD^1$ is about 0.1 L, the amplitude of CRM from about the transition to position $PP^1$ being about zero.

24. The process of claim 23 wherein $DD^2$ is about 0.4 L, the amplitude between positions $PP^1$ and $PP^2$ increasing substantially linearly.

25. The process of claim 23 wherein $DD^2$ is about 0.6 L, the amplitude between positions $PP^1$ and $PP^2$ increasing substantially linearly.

26. The process of claim 23 wherein $DD^2$ is about 0.8 L, the amplitude between positions $PP^1$ and $PP^2$ increasing substantially linearly.

27. The process of claim 12 wherein $DD^1$ is between about 0.1 L and about 0.4 L and $DD^2$ is between about 0.6 L and about 0.9 L, the amplitude of CRM increasing from a value between about 0.1 to less than about 2 rpm, at position $PP^1$ to a value between greater than about 2 to about 4 rpm, at position $PP^2$.

28. The process of claim 1 wherein CRM is increased as a function of axial length of the constant diameter portion of the ingot, said increase having an amplitude which is a function of a sine wave.

29. The process of claim 1 wherein CRM has an amplitude which ranges from about ±5% to about ±40% of CR.

30. The process of claim 1 wherein CRM has an amplitude which ranges from about ±5% to about ±25% of CR.

31. The process of claim 1 wherein CRM has an amplitude which ranges from about 2 to about 8 rpm above and below CR.

32. The process of claim 1 wherein CRM has a period ranging from about 30 seconds to about 90 seconds.

33. The process of claim 1 wherein CR ranges from about 5 to about 15 rpm during growth of the constant diameter portion.

34. The process of claim 33 wherein D, is between about 0.1 L to 0.4 L and $D_2$ is between about 0.6 L to 0.9 L, CR decreasing between positions $P_1$ and $P_2$ from a value between about 10 rpm to about 12 rpm to a value between about 6 rpm to about 8 rpm.

35. The process of claim 1 wherein the constant diameter portion has an average axial oxygen concentration of at least about 12 PPMA.

36. The process of claim 1 wherein the constant diameter portion has an average axial oxygen concentration which varies by less than about 4% as a function of length.

37. The process of claim 1 wherein the constant diameter portion has an average axial oxygen concentration which varies by less than about 2% as a function of length.

38. The process of claim 1 wherein the constant diameter portion of the ingot is grown in the absence of an applied magnetic field.

39. The process of claim 1 wherein the constant diameter portion of the ingot has an axial length of at least about 750 mm.

40. The process of claim 1 wherein the constant diameter portion of the ingot has a nominal diameter of at least about 200 mm.

41. The process of claim 1 wherein the constant diameter portion of the ingot has a nominal diameter of at least about 300 mm.

42. A single crystal silicon ingot prepared by the process of claim 1.

43. A process for pulling a single crystal silicon ingot in accordance with the Czochralski method, wherein a seed crystal is brought into contact with a silicon melt contained within a crucible, which is coaxial with the seed, and then is withdrawn therefrom to form a neck adjacent the seed crystal, a seed-cone adjacent the neck, and a constant diameter portion adjacent the seed-cone, the constant diameter portion having a nominal radius extending from the axis to a lateral surface thereof of at least 75 mm, the process comprising:

rotating the seed crystal and the crucible in opposite directions;

rotating a crucible at a mean crucible rotation rate (CR) during growth of the constant diameter portion which is sufficient to obtain a melt-solid interface having a height near the axis, $Z_a$, of at least about 5 mm, as measured from the melt surface, and a height $Z_{R/2}$, where $Z_{R/2}$ is the height of the interface above the melt surface at about a midpoint of the radius, which is at least about 120% of $Z_a$; and, controlling an average axial oxygen content in the constant diameter portion to be substantially constant by crucible rotation modulation (CRM).

44. The process of claim 43 wherein said interface is present after about 20% of the constant diameter portion has been formed.

45. The process of claim 43 wherein said interface is present after about 40% of the constant diameter portion has been formed.

46. The process of claim 43 wherein said interface is present after about 60% of the constant diameter portion has been formed.

47. The process of claim 43 wherein said interface is present after about 80% of the constant diameter portion has been formed.

48. The process of claim 43 wherein said constant diameter portion has an axial length of at least about 750 mm.

49. The process of claim 43 wherein $Z_a$ is at least about 10 mm.

50. The process of claim 43 wherein $Z_a$ is at least about 12 mm.

51. The process of claim 43 wherein $Z_{R/2}$ at least about 125% of $Z_a$.

52. The process of claim 43 wherein $Z_{R/2}$ at least about 135% of $Z_a$.

53. The process of claim 43 wherein CRM is initiated after about 5% of the constant diameter portion has been grown.

54. The process of claim 43 wherein CRM is initiated after about 10% of the constant diameter portion has been grown.

55. The process of claim 43 wherein CRM is modulated as a function of a sine wave.

56. The process of claim 43 wherein the constant diameter portion of the ingot has a nominal radius of at least about 100 mm.

57. The process of claim 43 wherein the constant diameter portion of the ingot has a nominal radius of at least about 150 mm.

58. A single crystal silicon ingot prepared by the process of claim 43.

59. A process for pulling a single crystal silicon ingot in accordance with the Czochralski method, wherein a seed crystal is brought into contact with a silicon melt contained within a crucible, which is coaxial with the seed, and then is withdrawn therefrom to form a neck adjacent the seed crystal, a seed-cone adjacent the neck, and a constant diameter portion adjacent the seed-cone, the constant diameter portion having a nominal diameter of at least 150 mm, the process comprising:

rotating the seed crystal and the crucible in opposite directions;

controlling a ratio $v/G_0$, wherein v is a growth velocity and $G_0$ is an average axial temperature gradient over a temperature range from solidification to no less than about 1300° C. for at least a segment of the constant diameter portion of the ingot, control of said ratio comprising decreasing a mean crucible rotation rate (CR) as said segment is grown;

controlling an average axial oxygen content in the segment to be substantially constant by crucible rotation modulation (CRM); and, controlling a cooling rate of said segment from the solidification temperature to about 1,050° C. or less, wherein said segment comprises an axially symmetric region which is substantially free of (i) agglomerated vacancy defects, or (ii) A-type agglomerated interstitial defects.

60. The process of claim 59 wherein, upon cooling of said segment from the solidification temperature, interstitials are the predominant intrinsic point defect in said axially symmetric region.

61. The process of claim 60 wherein said region is substantially free of B-type agglomerated interstitial defects.

62. The process of claim 61 wherein said axially symmetric region extends radially inward from the lateral edge of the ingot and has a width, as measured from the lateral edge radially toward the central axis, which is about 100% of the radius of the ingot.

63. The process of claim 62 wherein said region has a length, as measured along the central axis, of at least about 60% of the axial length of the constant diameter portion of the ingot.

64. The process of claim 62 wherein said region has a length, as measured along the central axis, of at least about 90% of the axial length of the constant diameter portion of the ingot.

65. The process of claim 59 wherein, upon cooling of said segment from the solidification temperature, vacancies are the predominant intrinsic point defect in said axially symmetric region.

66. The process of claim 65 wherein said axially symmetric region extends radially outward from the central axis and has a width, as measured from the central axis radially toward the lateral edge, which is about 100% of the radius of the ingot.

67. The process of claim 66 wherein said region has a length, as measured along the central axis, of at least about 60% of the length of the constant diameter portion of the ingot.

68. The process of claim 66 wherein said region has a length, as measured along the central axis, of at least about 90% of the length of the constant diameter portion of the ingot.

69. The process of claim 59 further comprising cooling said segment to a temperature less than about 800° C. and, as part of said cooling step, quench cooling at least a portion of said the segment through the temperature of nucleation for the agglomeration of self-interstitial defects.

70. The process of claim 59 wherein the segment of the constant diameter portion has (i) a length, L, as measured along the axis of the ingot from a transition from the seed-cone to the constant diameter portion, (ii) a first series of positions, $P_{(1 \to n)}$, located a distance, $D_{(1 \to n)}$, respectively, from the transition along the axis determined as a fraction of L, and (iii) a second series of positions, $PP^{(1 \to n)}$, located a distance, $DD^{(1 \to n)}$, respectively, from the transition along the axis determined as a fraction of L, wherein positions and their respective distances in the second series may be the same or different from those in the first, and further wherein the mean crucible rotation rate (CR) is decreased as a function of increasing axial length of the segment, wherein the mean crucible rotation rate at a position, $P_1$, is greater than the mean crucible rotation rate at a position, $P_2$, wherein $D_2 \geq (D_1 + 0.1 L)$.

71. The process of claim 70 wherein CRM is increased as a function of increasing axial length of the segment of constant diameter portion of the ingot.

72. The process of claim 71 wherein an amplitude of CRM at a position, $PP^1$, is less than the amplitude at a position, $PP^2$, wherein $DD^2 \geq DD^1$.

73. The process of claim 72 wherein $DD^2 \geq (DD^1 + 0.1 L)$.

74. The process of claim 59 wherein constant diameter portion has a nominal diameter of at least about 200 mm.

75. The process of claim 59 wherein constant diameter portion has a nominal diameter of at least about 300 mm.

* * * * *